United States Patent
Hideki

(10) Patent No.: US 6,294,425 B1
(45) Date of Patent: Sep. 25, 2001

(54) METHODS OF FORMING INTEGRATED CIRCUIT CAPACITORS BY ELECTROPLATING ELECTRODES FROM SEED LAYERS

(75) Inventor: Horii Hideki, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/686,839

(22) Filed: Oct. 10, 2000

(30) Foreign Application Priority Data

Oct. 14, 1999 (KR) .................................. 99-44593
Jan. 17, 2000 (KR) .................................. 00-1998

(51) Int. Cl.⁷ .................................. H01L 21/8242
(52) U.S. Cl. .................................. 438/253; 257/306
(58) Field of Search .................................. 438/253, 396, 438/397, 643, 650, 739, 306

(56) References Cited

U.S. PATENT DOCUMENTS

| 5,407,864 | 4/1995 | Kim ................................ 437/203 |
| 5,556,814 | * 9/1996 | Inoue et al. ................ 437/230 |
| 5,620,583 | 4/1997 | Kuhn et al. ................ 205/264 |
| 5,757,612 | 5/1998 | Acosta et al. ............. 361/321.4 |
| 5,789,320 | * 8/1998 | Andricacos et al. ........ 438/678 |
| 5,877,062 | 3/1999 | Horii ............................ 438/396 |
| 6,090,659 | 7/2000 | Laibowitz et al. ........... 438/240 |
| 6,107,136 | 8/2000 | Melnick et al. ............ 438/253 |
| 6,188,120 | * 2/2001 | Andricacos et al. ........ 257/532 |

* cited by examiner

*Primary Examiner*—David Nelms
*Assistant Examiner*—Quoc Hoang
(74) *Attorney, Agent, or Firm*—Myers Bigel Sibley & Sajovec

(57) ABSTRACT

Methods of forming integrated circuit capacitors include forming a first electrically conductive layer on a semiconductor substrate and forming a first electrically insulating layer on the first electrically conductive layer. The first electrically insulating layer and the first electrically conductive layer are then patterned to define an opening in the first electrically insulating layer and expose a sidewall of the first electrically conductive layer. A second electrically conductive layer is then electroplated into the opening, using the exposed sidewall of the first electrically conductive layer as an electroplating seed. The patterned first electrically insulating layer and at least a portion of the patterned first electrically conductive layer are then removed to define a first capacitor electrode as the electroplated second electrically conductive layer. A capacitor dielectric layer is then formed on the first capacitor electrode. A complete capacitor structure is then provided by forming a second capacitor electrode on the capacitor dielectric layer, opposite the first capacitor electrode.

47 Claims, 12 Drawing Sheets

METHODS OF FORMING INTEGRATED CIRCUIT CAPACITORS BY ELECTROPLATING ELECTRODES FROM SEED LAYERS

RELATED APPLICATIONS

This application is related to Korean Application Nos. 99-44593and 00-1998, filed Oct. 14, 1999 and Jan. 17, 2000, respectively, the disclosures of which are hereby incorporated herein by reference.

FIELD OF THE INVENTION

The present invention relates to a method for manufacturing semiconductor devices, and more particularly, to a method for manufacturing a capacitor of a semiconductor memory device using an electroplating method.

BACKGROUND OF THE INVENTION

With the increase in integration density of semiconductor memory devices, many approaches have been used to increase the capacitance of a capacitor in a limited cell area. Some of the approaches used include a method of increasing the electric field created in the capacitor by reducing the thickness of a dielectric film of the capacitor, and a method of increasing the effective area of a capacitor by designing the lower electrode of the capacitor to have a three-dimensional structure.

However, even if these methods are applied in the manufacture of semiconductor memory devices, if a common capacitor dielectric film, such as $TiO_2$ or $SiO_2$ is employed, a sufficient capacitance typically cannot be secured for the operation of a semiconductor memory device having an integration density of 1 gigabits or more. To address this problem, great interest has been focused on a method of forming the capacitor dielectric film with a ferroelectric or high-dielectric film, such as $(Ba,Sr)TiO_3(BST)$, $PbZrTiO_3$ (PZT) and $(Pb,La)(Zr,Ti)O_3(PLZT)$.

For example, according to a conventional method for manufacturing a semiconductor memory device having a capacitor dielectric film formed of a high-dielectric film or ferroelectric film, first, a lower electrode pad is formed of a doped polysilicon on an impurity injection region of a semiconductor substrate. After formation of a lower electrode contact electrically connected to the lower electrode pad, a capacitor lower electrode is formed on the lower electrode contact. Next, a capacitor dielectric film is formed of a high-dielectric film or ferroelectric film on the capacitor lower electrode. To crystalize the capacitor dielectric film to give enhanced insulation characteristics, i.e., higher capacitance and lower leakage current of the capacitor, the capacitor dielectric film is subjected to a high-temperature heat treatment in an oxygen atmosphere. However, if the high-temperature heat treatment is carried out at high temperatures as high as 600 to 900° C. under an oxygen atmosphere, and if the capacitor lower electrode is formed of a common doped polysilicon, contact resistance can be degraded due to oxidation of the capacitor lower electrode during the high-temperature heat treatment. In addition, there is a problem in that a metal silicide layer is formed between the capacitor dielectric film and the capacitor lower electrode.

For this reason, when a capacitor of a semiconductor memory device is formed using a high-dielectric or ferroelectric layer, the platinum (Pt) group elements in the Periodic Table, or an oxide of these elements, for example, Pt, iridium (Ir), ruthenium (Ru), $RuO_2$, or $IrO_2$ is commonly used as an electrode material.

In the conventional method, for the formation of the lower electrode with a Pt group metal, a conductive film is formed of a Pt group metal and patterned into a lower electrode by a dry etching method. However, it is not easy to convert the Pt group metal forming the conductive layer into volatile gases by dry etching, and thus there is a problem in separating the lower electrode into individual unit cells. Thus, the dry etching method has a limitation in forming a semiconductor memory device whose lower electrode has a width of 300 nm or less, especially in forming a semiconductor memory device having an integration density of 4 gigabits or more. Due to this drawback of the dry etching technique, a variety of methods for the formation of a capacitor lower electrode have been suggested.

Another conventional method of forming a capacitor lower electrode with a Pt group metal by electroplating will be described. FIGS. 1A through 1C are sectional views of successive stages of a conventional method for forming a capacitor lower electrode with a Pt layer by electroplating.

Referring to FIG. 1A, a lower electrode pad 12 formed of a conductive polysilicon is formed in the impurity injection region (not shown) of a semiconductor substrate 10. This impurity injection region may constitute a source/drain region of a memory cell access transistor. Next, an interlevel dielectric (ILD) film 14, which electrically isolates spatially adjacent lower electrode pads 12, is formed over the lower electrode pad 12. The ILD film 14 is patterned by photolithography to form an opening 16 exposing the lower electrode pad 12, and a lower electrode seed layer 18 formed of a Pt group metal is deposited over the bottom surface and sidewalls of the opening 16, and the top of the ILD film 14. Following this, a plating mask pattern 20 is formed around the opening 16. The plating mask pattern 20 defines the shape of the lower electrode by exposing a region of the lower electrode seed layer on which a lower electrode is formed.

After the formation of the lower electrode seed layer 18 and the plating mask pattern 20, a process of forming a capacitor lower electrode is carried out by electroplating. For example, for a capacitor lower electrode formed of Pt, the semiconductor substrate 10 is immersed into a plating solution containing Pt salt. Next, the cathode of a power source 22 is connected to the lower electrode seed layer 18 by a first wire 24, while the anode of the power source 22 is connected to a Pt source electrode 28 by a second wire 26. As a result, a Pt layer is deposited on the lower electrode seed layer 18 to the same level as the top of the plating mask pattern 20. A portion of the Pt layer filling the opening 16 (i.e., in the lower region from dashed lines in FIG. 1A) forms a lower electrode contact 30, and the other portion of Pt layer on the lower electrode contact 30 forms a capacitor lower electrode 32.

Referring to FIG. 1B, after the formation of the lower electrode contact 30 and the capacitor lower electrode 32 by electroplating, the plating mask pattern 20 is removed by wet etching. Then, the lower electrode seed layer 18 on top of the ILD film 14, which is exposed by the removal of the plating mask pattern 20, is removed to separate the lower electrode 32 in cell units.

Here, in the case where the lower electrode seed layer 18 is formed of Pt, a dry etching technique typically should be applied in removing the lower electrode seed layer 18 exposed by the removal of the plating mask pattern 20. However, it is not easy to convert Pt of the lower electrode seed layer 18 into volatile gases by dry etching to separate individual capacitor lower electrode cells. Particularly for the fabrication of a semiconductor memory device having a design rule of 0.15 μm or less, a pitch of the lower electrode seed layer 18 between adjacent lower electrodes 32 is further decreased, so that separating the capacitor lower electrode in cell units becomes more difficult.

To solve this problem, a method of forming the lower electrode seed layer 18 with ruthenium (Ru), which can be easily converted into volatile compounds by dry etching, has been suggested. However, when the lower electrode seed layer 18 is formed of Ru, a Pt—Ru alloy is formed in the interface between the lower electrode contact 30 formed of Pt and the lower electrode seed layer 18 remaining after node separation, which causes a problem in a subsequent heat treatment of a capacitor dielectric film. This will be described with reference to FIG. 1C.

Referring to FIG. 1C, after separation of the capacitor lower electrode 32 into unit cells by a node separation process, a ferroelectric material or a high-dielectric material is deposited over the resulting structure to form a dielectric film 33. Next, a high-temperature heat treatment (indicated by arrows) is carried out in an oxygen atmosphere so as to enhance the insulating characteristics of the dielectric film 33. However, in the case where the lower electrode seed layer 18 is formed of Ru, a Pt—Ru alloy is formed in the interface between the lower electrode seed layer 18 formed of Ru, which is left after node separation, and the lower electrode contact 30 formed of Pt. Ru of the alloy, which has a weak oxidation resistance, compared to Pt, is oxidized when the dielectric layer 33 is subjected to a high-temperature heat treatment process. The formation of a Ru oxide, which has a larger volume than Pt, in the high-temperature treatment process on the dielectric layer 33 changes the morphology of the capacitor lower electrode 32, which applies a physical stress to the dielectric layer 33. As a result, the interfacial properties between the capacitor lower electrode 32 and the dielectric film 33 are degraded, thereby increasing the leakage current of the capacitor.

SUMMARY OF THE INVENTION

It is an objective of the present invention to provide a method for manufacturing a capacitor of a semiconductor memory device, in which removal of a lower electrode seed layer used for forming a capacitor lower electrode by the electroplating is easy and the lower electrode seed layer is not left on a completed capacitor.

It is another objective of the present invention to provide a method for manufacturing a capacitor of a semiconductor memory device, in which although a lower electrode seed layer used for forming a capacitor lower electrode by the electroplating and the lower electrode layer are formed of different materials, deterioration of the electrical properties of the capacitor by the lower electrode seed layer can be prevented.

It is still another objective of the present invention to provide a method for manufacturing a capacitor of a semiconductor memory device, which does not require formation of a lower electrode contact using a barrier material before electroplating to form a capacitor lower electrode.

According to an aspect of the present invention, there is provided a method for manufacturing a capacitor of a semiconductor memory device, comprising the steps of forming a lower electrode seed layer over a semiconductor substrate having a conductive region electrically connected to an active region formed in the semiconductor substrate. A plating mask layer is formed over the lower electrode seed layer. The plating mask layer and the lower electrode seed layer are patterned to form a plating mask pattern and a lower electrode seed pattern, both of which define a region where a capacitor lower electrode is to be formed, thereby forming an opening exposing the conductive region and the sidewalls of the plating mask pattern. Electroplating is performed using the lower electrode seed pattern exposing its sidewalls by the opening, to form a lower electrode conductive layer in the opening. Then, the plating mask pattern and the lower electrode seed pattern are removed to expose the sidewalls of the lower electrode conductive layer, thereby resulting in a capacitor lower electrode. A capacitor dielectric layer, and a capacitor lower electrode are formed in sequence on the capacitor lower electrode.

Preferably, the lower electrode seed layer comprises a platinum (Pt) group metal layer, a Pt group metal oxide layer, a conductive material layer having a perovskite structure, a conductive metal layer, a metal silicide layer, a metal nitride layer or a multi-layer of these layer.

Preferably, the plating mask layer is formed of a boro-phospho-silicate glass (BPSG) layer, a spin-on glass (SOG) layer, a phospho-silicate glass (PSG) layer, a photoresist layer, a diamond-like carbon layer, a $SiO_x$ layer, a $SiN_x$ layer, a $SiON_x$ layer, a $TiO_x$ layer, a $AlO_x$ layer, a $AlN_x$ layer or a mult-layer of these layers.

Preferably, the conductive mask pattern and the lower electrode seed pattern are removed by wet etching or dry etching. In certain cases, the plating mask pattern and the lower electrode seed pattern may be removed by performing wet etching or drying etching one time.

Before the formation of the lower electrode seed layer, an etch stop layer may be formed over the semiconductor substrate. In this case, the lower electrode seed layer is formed over the etchstop layer, and the opening is formed by patterning the plating mask layer, the lower electrode seed layer and the etchstop layer. The capacitor upper electrode may be formed by electroplating.

According to another aspect of the present invention, there is provided a method for manufacturing a capacitor of a semiconductor memory device, comprising the steps of forming a lower electrode pad with a conductive material on an active region of a semiconductor substrate. A first inter-level dielectric (ILD) film is formed over the lower electrode pad, and bit lines are formed on the first ILD film. A second ILD film is formed over the bit lines, and then a lower electrode seed layer is formed over the second ILD film. A plating mask layer is formed over the lower electrode seed layer. Next, the plating mask layer, the lower electrode seed layer, the second ILD film and the first ILD film are patterned by photolithography to form an opening exposing the lower electrode pad. The opening is filled with a conductive layer, the conductive layer deposited on or over the substantially the same level to the top of the lower electrode seed layer, by electroplating using the patterned lower electrode seed layer. Then, the patterned plating mask and lower electrode seed layer are removed to expose the sidewalls of the conductive layer, thereby forming a capacitor lower electrode. A capacitor dielectric layer and a capacitor upper electrode are formed in sequence on the capacitor lower electrode.

The formation of the conductive layer may be performed as follows. First, a conductive barrier layer is formed on the lower electrode pad exposed by the opening so as not to cover the sidewalls of the lower electrode seed layer exposed by the opening. Next, electroplating is performed with the patterned lower electrode seed layer to form the conductive layer over the barrier layer.

The formation of the barrier layer may comprise depositing a barrier material to fill the opening and to cover the plating mask layer. Next, the barrier material is removed until the top of the plating mask pattern is exposed. The barrier material filling the opening is selectively removed to expose the sidewalls of the patterned lower electrode seed layer. Preferably, the barrier layer is formed of a metal silicide layer, a metal nitride layer, a doped polysilicon layer or a multi-layer of these layers.

The plating mask layer and the lower electrode seed layer, which are patterned in forming the opening may be removed by performing wet or dry etching. In certain cases, the plating mask layer and lower electrode seed layer patterned in forming the opening may be removed by performing wet etching one time. Before the formation of the lower electrode seed layer, an etchstop layer may be formed over the second ILD film. Before the formation of the second ILD film, a spacer and a capping insulating layer may be formed on the sidewalls and the top surface of the bit lines, respectively, using a material having an etching selectivity with respect to the second ILD film. In this case, the opening is self-aligned with the bit line masked by the spacer and the capping insulating layer. Before filling the opening with the conductive layer, a liner seed layer may be formed along a lower portion of the opening, the liner seed layer electrically connected to the lower electrode seed layer exposed by the opening.

The formation of the liner seed layer may be performed as follows. First, a semi-spherical seed is formed on the sidewalls of the patterned lower electrode seed layer. Next, reactive ion etching is performed on the semi-spherical seed at a low temperature to redeposit the material falling from the semi-spherical seed along the lower portion of the opening. The formation of the liner seed layer may comprise lining the semiconductor substrate having the opening with a conductive material. Next, reactive ion etching is performed on the conductive material at a low temperature to form a spacer as the liner seed layer. Preferably, the lower electrode pad is formed as a multi-layer. In this case, the uppermost layer of the lower electrode pad may be formed as a conductive barrier layer. When the lower electrode pad is formed as a multi-layer, the uppermost layer of the lower electrode pad may be a Pt group metal layer and the lower electrode pad may include at least one conductive barrier layer underneath the uppermost layer. In this case, the liner seed layer may be formed by reactive ion etching the uppermost layer of the lower electrode pad at a low temperature.

The formation of a capacitor lower electrode by the inventive method can solve the conventional problems in separating the lower electrode into unit cells by dry etching. According to another aspect of the present invention, an opening exposing a lower electrode pad can be formed by a self-aligning technique with a masked bit line, and thus the opening can be obtained by performing only one photolithography process. According to still another aspect of the present invention, after the formation of the lower electrode by electroplating, a lower electrode seed pattern used for the electroplating can be completely removed, thereby preventing deterioration of electrical properties of the capacitor due to the lower electrode seed layer left after the electroplating. Furthermore, it is not necessary to form the lower electrode and the lower electrode seed layer with the same material. The lower electrode seed layer can be formed of a different material from that for the lower electrode, as needed.

BRIEF DESCRIPTION OF THE DRAWINGS

The above objectives and advantages of the present invention will become more apparent by describing in detail preferred embodiments thereof with reference to the attached drawings in which.

DESCRIPTION OF PREFERRED EMBODIMENTS

Figure 1A:
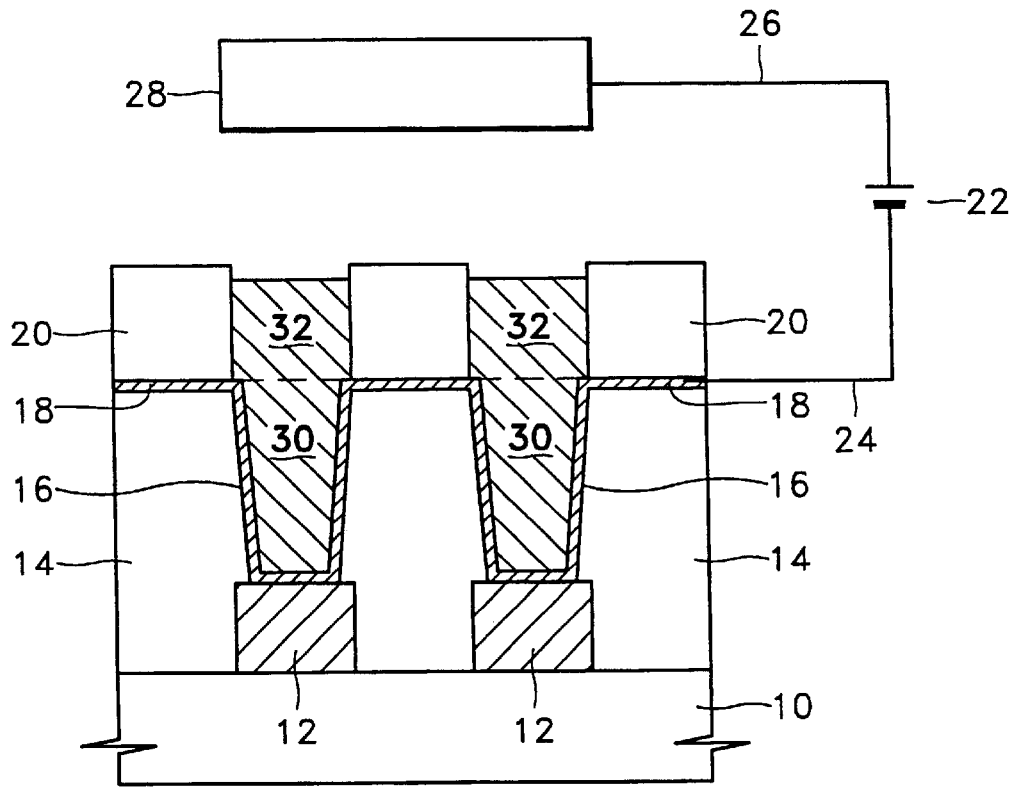
FIGS. 1A through 1C are sectional views of successive stages of a conventional method for manufacturing a capacitor lower electrode by electroplating.
Figure 1B:
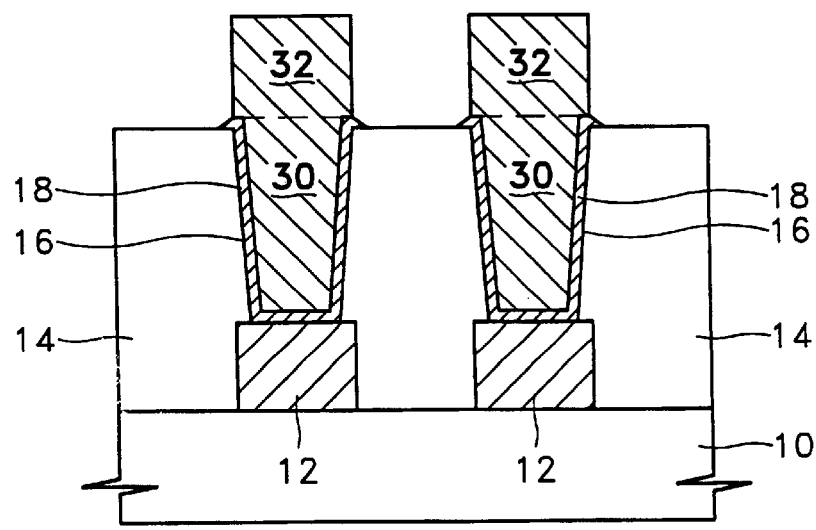
Figure 1C:
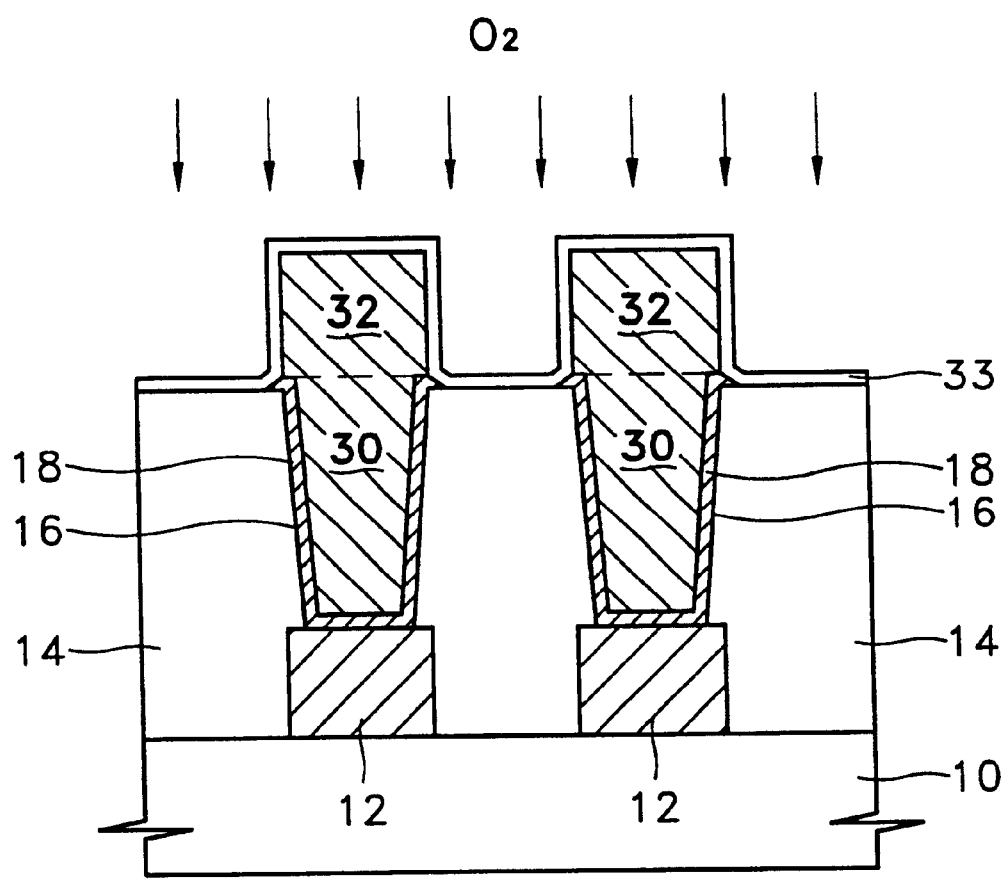

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It is also noted that like reference numerals may be used to designate identical or corresponding parts throughout the drawings.

Figure 2:
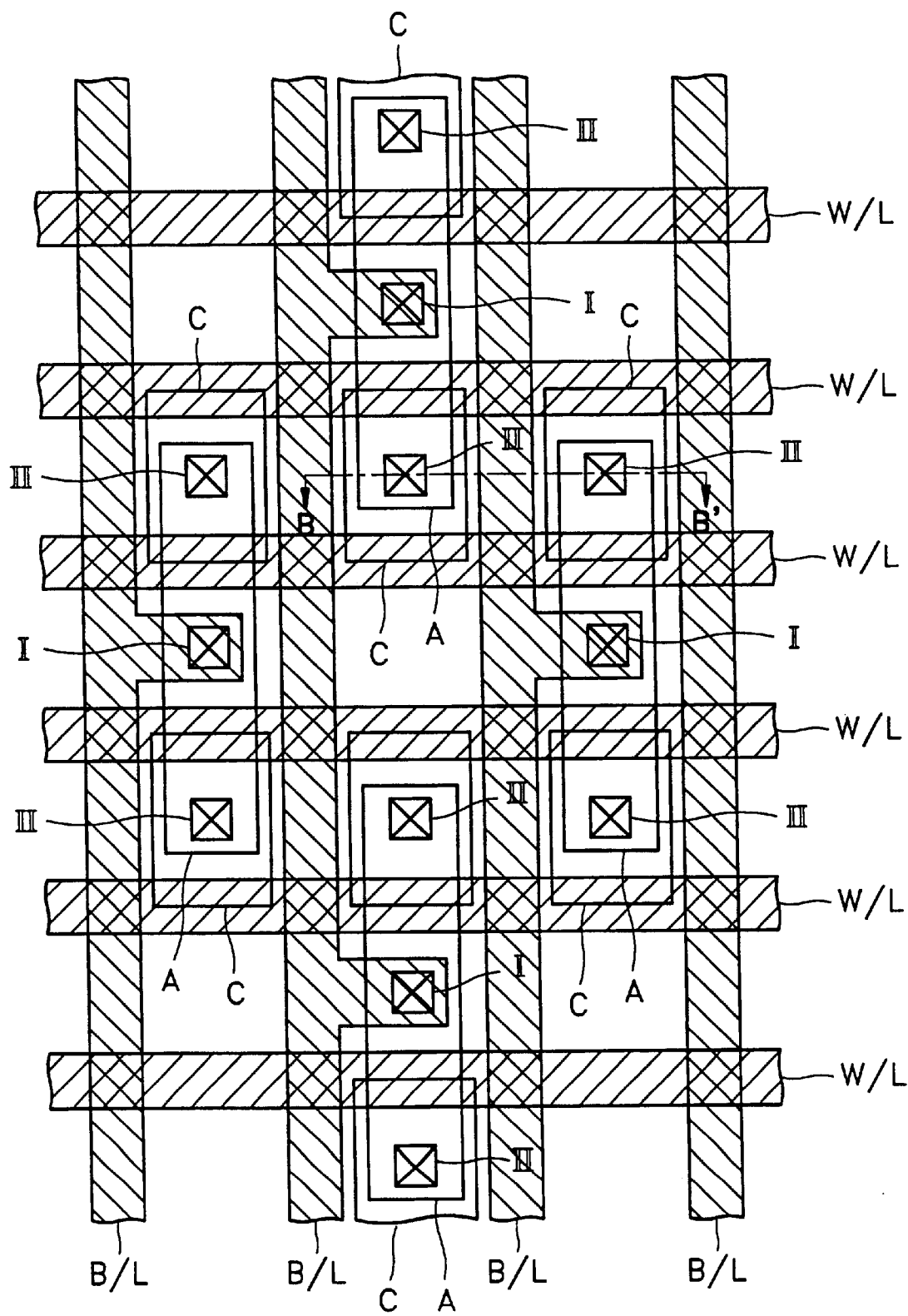
FIG. 2 is a layout to be applied in manufacturing a capacitor of a semiconductor memory device by electroplating according to the present invention.

A layout to be applied to the manufacture of a capacitor of a semiconductor memory device according to the present invention is shown in FIG. 2. Referring to FIG. 2, an active region A is defined by an isolation layer, and two word lines W/L are located on the active region A. Bit lines B/L are overlapped with the word lines W/L at right angles. A bit line contact I is on a drain region of the active region A, and a lower electrode contact II is on a source region of the active region A. A capacitor lower electrode C of the semiconductor memory device is on the lower electrode contact II. The preferred embodiments of the present invention will be described with reference to the cross-section taken along line B–B' of FIG. 2.

Figure 3A:
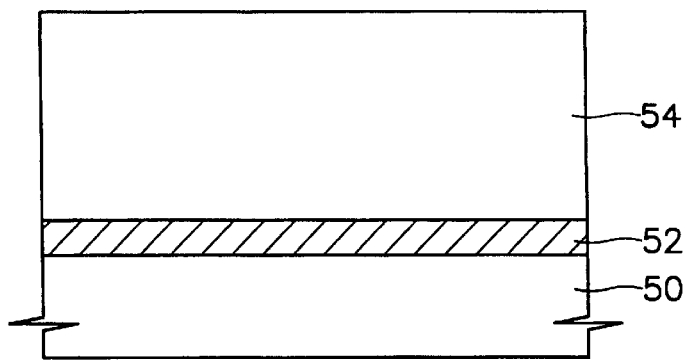
FIGS. 3A through 3F are sectional views illustrating a first embodiment of the manufacture of a capacitor of a semiconductor memory device according to the present invention.

FIGS. 3A through 3F are sectional views of successive stages of a method for manufacturing a semiconductor memory device according to a first embodiment of the present invention. Referring to FIG. 3A, a lower electrode seed layer 52 is formed over a semiconductor substrate 50. Although not shown, the semiconductor substrate 50 may be a silicon substrate having an impurity injection region, or having a layered structure, such as gate electrode and bit lines, on the top surface. The impurity injection region may comprise a source/drain region of a memory cell access transistor that is coupled to a respective word line W/L.

Preferably, the lower electrode seed layer 52 is formed of a conductive material having oxidation resistance. For example, the lower electrode seed layer 52 may be formed of a platinum (Pt) group metal layer, a Pt group metal oxide layer, a conductive material layer having a perovskite structure, a conductive metal layer, a metal silicide layer, a metal nitride layer or a multi-layer combined with these layers. The Pt group metal layer includes a Pt layer, a rhodium (Rh) layer, a ruthenium (Ru) layer, an iridium (Ir) layer, an osmium (Os) layer and a palladium (Pd) layer. The Pt metal oxide layer includes a $PtO_x$ layer, a $RhO_x$ layer, a $RuO_x$ layer, a $IrO_x$ layer, an $OsO_x$ layer and a $PdO_x$ layer. The conductive material layer having the perovskite structure includes a $CaRuO_3$ layer, a $SrRuO_3$ layer, a $BaRuO_3$ layer, a $BaSrRuO_3$ layer, a $CaIrO_3$ layer, a $SrIrO_3$ layer, a $BaIrO_3$ layer and a $(La,Sr)CoO_3$ layer. The conductive metal layer may include a copper (Cu) layer, an aluminum (Al) layer, a tantalum (Ta) layer, a molybdenum (Mo) layer, a tungsten (W) layer, a gold (Au) layer and a silver (Ag) layer. The metal silicide layer may include a $WSi_x$ layer, a $TiSi_x$ layer, a $CoSi_x$ layer, a $MoSi_x$ layer and a $TaSi_x$ layer. The metal nitride layer may include a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer and a TaAlN layer.

Preferably, the lower electrode seed layer 52 is formed of a material layer having oxidation resistance, and is easy to remove by wet etching or dry etching. This is because a portion of the lower electrode seed layer 52 should be removed by wet or dry etching in a subsequent process. For example, if a portion of the lower electrode seed layer 52 is removed by dry etching, the lower electrode seed layer 52 may be formed of a Ru layer. On the other hand, if a portion of the lower electrode seed layer 52 is removed by wet etching, the lower electrode seed layer 52 may be formed of a Cu or Ag layer.

A variety of processes can be applied to form the lower electrode seed layer 52, including, for example, sputtering, chemical vapor deposition, physical deposition, atomic layer deposition and laser ablation. A preferred method for forming the lower electrode seed layer 52 varies depending on the type of material layer for the lower electrode seed layer 52.

For example, if the lower electrode seed layer 52 is formed of a Ru layer, use of sputtering is preferred. When forming the lower electrode seed layer 52 formed of a Ru layer by sputtering, DC sputtering equipment can be employed. The lower electrode seed layer 52 may be formed with a DC power of about 1000 W by supplying argon (Ar) gas at about 20 sccm. Here, the temperature of the wafer is set to 200° C.

Preferably, the lower electrode seed layer 52 is formed to a thickness of about 50 to 2000 Å. For example, if the lower electrode seed layer 52 is formed of a Ru layer, the lower electrode seed layer 52 may be formed to have a thickness of 500 Å.

After the formation of the lower electrode seed layer 52, a plating mask layer 54 is formed over the lower electrode seed layer 52. The plating mask layer 54 must be an insulator for use in a subsequent electroplating process as a plating mask, and must be easy to remove by dry or wet etching after formation of a capacitor lower electrode. Preferably, the plating mask layer 54 is formed of a boro-phospho-silicate glass (BPSG) layer, a spin-on glass (SOG) layer, a phospho-silicate glass (PSG) layer, a photoresist layer, a diamond-like carbon (DLC) layer, a $SiO_x$ layer, a $SiN_x$ layer, a $SiON_x$ layer, a $TiO_x$ layer, a $AlO_x$ layer, a $AlN_x$ layer, or multi-layer of these layers.

A variety of processes can be applied to form the plating mask layer 54, including, for example, sputtering, chemical vapor deposition, physical deposition and atomic layer deposition. A preferred method for forming the plating mask layer 54 varies depending on the type of material layer for the plating mask layer 54. For example, if the plating mask layer 54 is formed of a silicon oxide layer, use of chemical vapor deposition is preferred.

The thickness of the plating mask layer 54 is determined by the dimensions of the capacitor lower electrode to be formed. For example, if a capacitor lower electrode having a thickness of about 1000 Å is intended, the plating mask layer 54 may be formed to have a thickness of about 1000 Å.

Figure 3B:
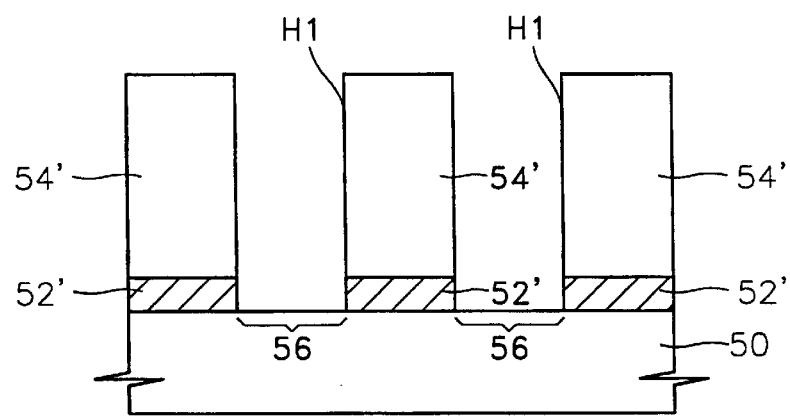

Referring to FIG. 3B, a portion of the plating mask layer 54, which is located above a lower electrode region, and a portion of the lower electrode seed layer 52, which is just below the portion of the plating mask layer 54, are selectively removed by reactive ion etching (RIE) by photolithography, which results in a plating mask pattern 54' and a lower electrode seed pattern 52'. The plating mask pattern 54' and the lower electrode seed pattern 52' define an opening H1, which exposes a conductive region 56, i.e., the lower electrode region on the semiconductor substrate 50. The exposed sidewalls of the plating mask pattern 54' and the lower electrode seed pattern 52' form the sidewalls of the opening H1.

Figure 3C:
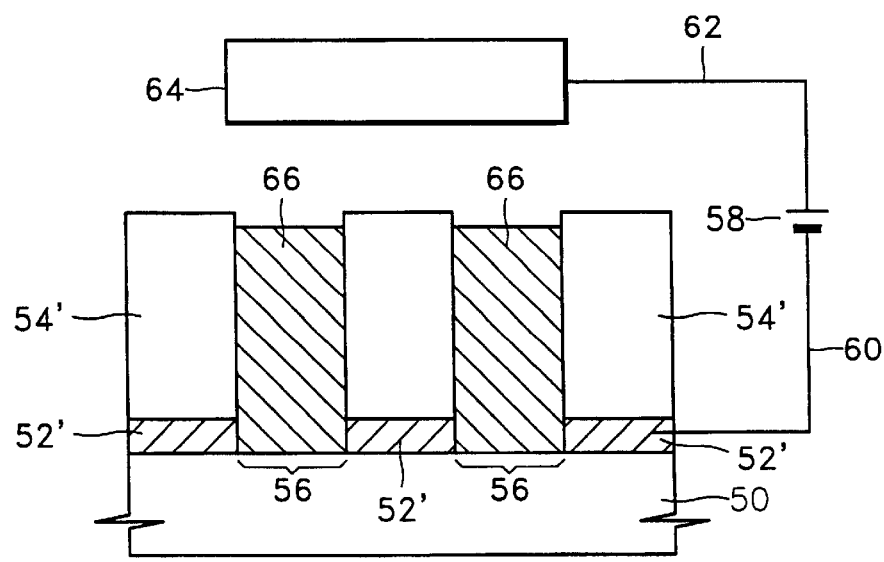

Referring to FIG. 3C, a lower electrode conductive layer 66 is formed in the opening H1 by electroplating. In particular, the cathode of a power source 58 is connected to the lower electrode seed pattern 52' by a first wire 60, while the anode of the power source 58 is connected to a source electrode 64 by a second wire 62. Following this, the semiconductor substrate 50 is immersed into a plating solution for electroplating. As a result, a metal that is a substantially the same kind as the source electrode 64 starts to be deposited on the sidewalls of the lower electrode seed pattern 52' exposed by the opening H1. The electroplating continues until the metal deposited on the sidewalls of the lower electrode seed pattern 52' fills the opening H1 up to a level corresponding to the height of the desired capacitor lower electrode conductive layer 66, which results in the lower electrode conductive layer 66. For example, the lower electrode conductive layer 66 may be deposited to approximately the same level as the top of the plating mask pattern 54'.

When the lower electrode conductive layer 66 is formed of a Pt layer, it is preferable that ammonium platinum nitrite $(Pt(NH_3)_2(NO_2)_2)$ is used as a plating solution, and a Pt electrode is adopted as the source electrode 64. Here, the electroplating conditions can be set as follows: the temperature of the plating bath is 70 to 90° C., the concentration of the plating solution is 8 to 12 g/l, the pH of the plating solution is 0.8 to 4, the concentration of the conductive salts of sulfuric acid in the plating solution is 0.5 to 1.5 g/l, and the current density is 0.1 to 2 $A/cm^2$.

Alternatively, when the lower electrode conductive layer 66 is formed of a Pt layer, ammonium chloroplatinate $((NH_4)_2PtCl_6))$ or chloroplatinic acid $(H_2PtCl_6)$ may be used as a plating solution.

It is appreciated that a plating solution containing metal salt, exclusive of Pt, is utilized as a plating solution, the opening H1 may be filled with the metal of the metal salt. The plating solution may be a solution containing a metal salt of Pt, Ir, Ru, Rh, Os, Pd, Au, Ag, Co, Ni, or a mixture of these metals. For example, the plating solution may include $(NH_4)_2Pt(Cl_6)$, $H_2PtCl_6$, $RuNOCl_3$, $RuCl_3$, $IrCl_4$, $(NH_4)_2IrCl_6$, and the like. The source electrode 64 can be formed of Pt, Ir, Ru, Rh, Os, Pd, Au, Ag, Co, Ni, W or an alloy of these elements.

Figure 3D:
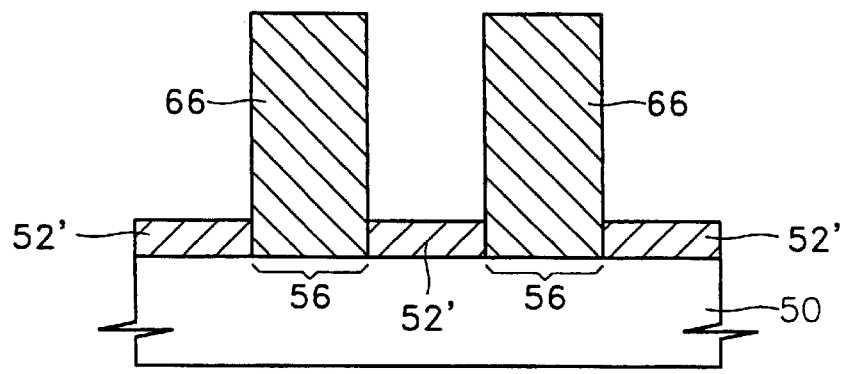

Referring to FIG. 3D, the plating mask pattern 54' is selectively removed to expose a portion of the sidewalls of the lower electrode conductive layer 66. For example, if the plating mask pattern 54' is formed of $SiO_2$, the plating mask pattern 54' can be removed by wet etching in a hydrofluoric acid (HF) solution or a buffered oxide etchant (BOE). The lower electrode seed pattern 52' may be removed during the removal of the plating mask pattern 54', or may be removed separately by an additional process. For example, if the lower electrode seed pattern 52' is formed of Pt or Ru, which is insoluble in a HF or BOE solution, the lower electrode seed pattern 52' is left unremoved, during the removal of the plating mask pattern 54'.

Figure 3E:
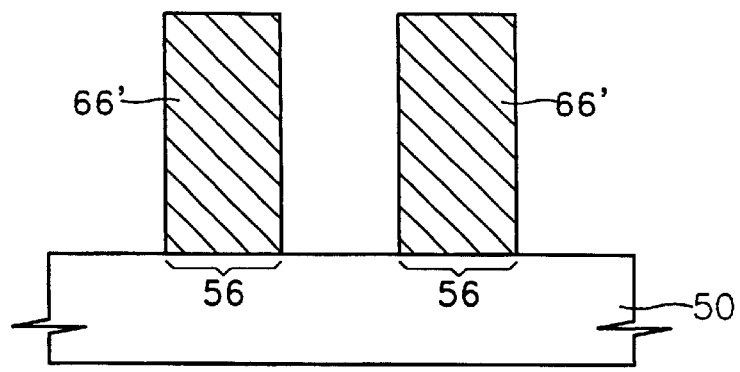

Referring to FIG. 3E, the lower electrode seed pattern 52' is removed, so that the sidewalls of the lower electrode conductive layer 66 is completely exposed. Here, the lower electrode seed pattern 52' can be removed by wet or dry etching, depending on the type of material layer for the lower electrode seed pattern 52'. For example, if the lower electrode seed pattern 52' is formed of a Ru layer, use of reactive ion etching is preferred, which is relatively easy to convert Ru into volatile gas compounds compared to other Pt-group metals.

If the lower electrode seed pattern 52' is formed of Cu or Ag that is soluble in HF solution, the conductive mask pattern 54' and the lower electrode seed pattern 52' can be removed at the same time by performing wet etching one time, with HF solution. As the plating mask pattern 54' and the lower electrode seed pattern 52' are removed, capacitor lower electrodes 66' isolated from each other in cell units are obtained.

Figure 3F:
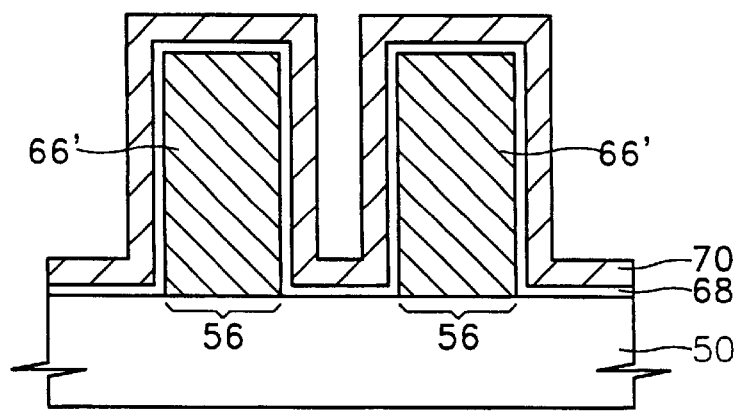

Referring to FIG. 3F, a dielectric material is deposited over the resulting structure having the capacitor lower electrodes 66' by CVD or sputtering, which results in a dielectric film 68 having a predetermined thickness. The thickness of the dielectric film 68 is determined in consideration of the capacitance of a capacitor to be formed. For example, the dielectric film 68 may be formed to have a thickness of 20 nm. The dielectric film 68 may be formed of a $Ta_2O_5$ layer, a $SrTiO_3$(STO) layer, a $(Ba,Sr)TiO_3$(BST) layer, a $PbZrTiO_3$(PZT) layer, a $SrBi_2Ta_2O_9$(SBT) layer, a $(Pb,La)(Zr,Ti)O_3$(PLZT) layer, a $Bi_4Ti_3O_{12}$ layer, or a multi-layer of these layers.

Following this, a conductive material is deposited over the dielectric film 68 by CVD or sputtering, to form a capacitor upper electrode 70. The capacitor upper electrode 70 may be formed of a material layer that is substantially the same as that of the lower electrode seel layer 52 (see FIG. 3A).

Alternatively, the capacitor upper electrode 70 may be formed by depositing a Pt thin film to a predetermined thickness, for example, to 50 nm, by metal-organic deposition (MOD) method. The thickness and density of the Pt thin film serving as the capacitor upper electrode 70 can be varied by adjusting the spin frequency for spin coating, and the concentration of a Pt MOD solution (mixture of a 10% Pt-acetylacetonate and a 90% ethanol).

Alternatively, if the capacitor upper electrode 70 is formed of a Pt layer, a spin coating technique using colloid can be applied. For example, a Pt colloid solution, in which about 5% by weight Pt colloid having a particle size of about 30 to 50 Å is uniformly dispersed in an organic solvent comprising an alcoholic component, is spin coated to a thickness of about 1000 Å by a common spin coating technique. Following this, the resulting structure is subjected to heat treatment at a temperature of 300 to 500° C. for about 10 minutes. As a result, the alcoholic component is evaporated and the remaining Pt thin film serves as the capacitor upper electrode 70.

Figure 4:
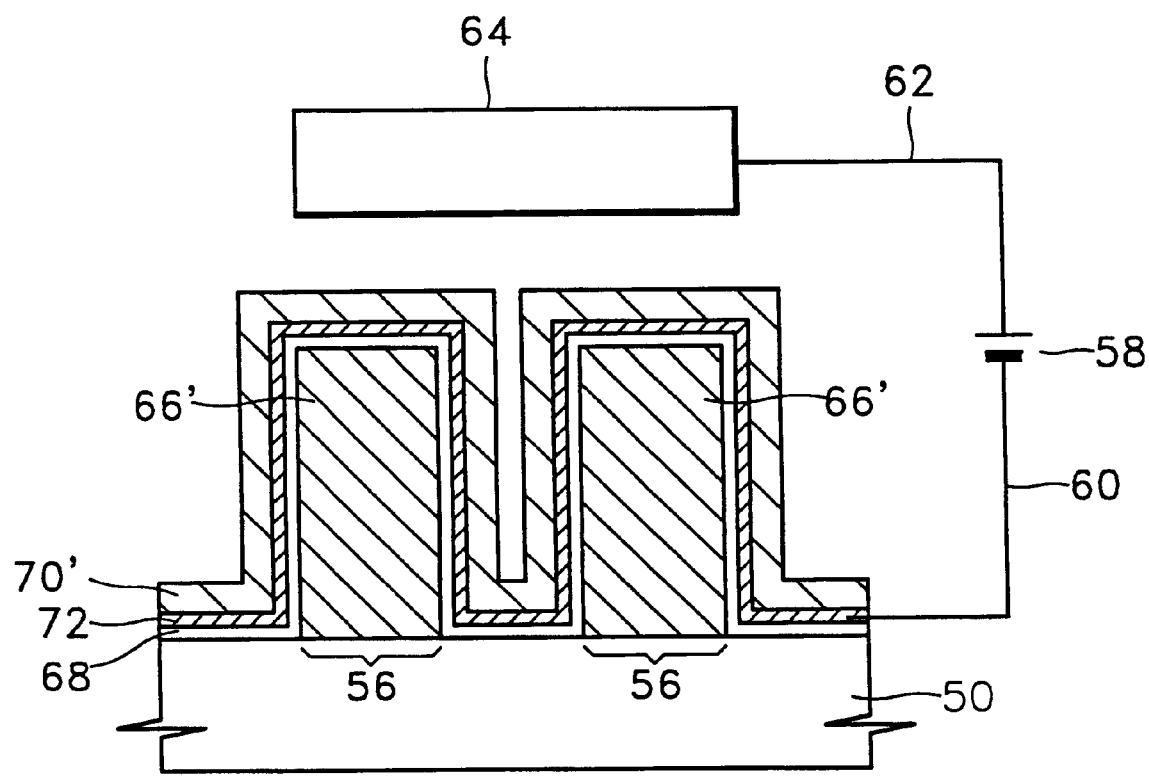
FIG. 4 is a sectional view illustrating a second embodiment of the inventive method.

FIG. 4 is a sectional view illustrating a second embodiment of the method for manufacturing a capacitor of a semiconductor memory device according to the present invention. The second embodiment is carried out in the same way as in the first embodiment, except that a capacitor upper electrode 70' is formed by electroplating. In particular, the capacitor lower electrode 66' is formed on the semiconductor substrate 50 in substantially the same way as in the first embodiment described with reference to FIGS. 3A through 3E. The dielectric film 68 is formed by a method that is substantially the same as that described with reference to FIG. 3F. Next, an upper electrode seed layer 72 is formed over the dielectric film 68 by CVD or sputtering, to have a thickness of about 50 to 1000 Å. The upper electrode seed layer 72 can be formed of a material layer that is substantially the same as that used for the lower electrode seed layer of the first embodiment. Following this, the cathode of the power source 58 is connected to the upper electrode seed layer 72 by the first wire 60, while the anode of the power source 58 is connected to the source electrode 64 by the second wire 62. Then, the capacitor upper electrode 70' is deposited over the upper electrode seed layer 72 to a desired thickness by an electroplating process that is substantially the same as that described with reference to FIG. 3C.

For the formation of the capacitor upper electrode 70' by electroplating, a solution containing a metal salt of Pt, Ir, Ru, Rh, Os, Pd, Au, Ag, Cu, Mo, Co, Ni, Zn, Cr, Fe or a mixture of these metals can be utilized as a plating solution. Also, the source electrode 64 for use in the formation of the capacitor upper electrode 70' by electroplating may include Pt, Ir, Ru, Rh, Os, Pd, Au, Ag, Cu, Mo, Co, Ni, Zn, Cr, Fe and an alloy of these elements. Use of electroplating in the formation of the capacitor upper electrode 70' enables formation of a layer with superior step coverage, and thus the capacitor upper electrode 70' having a uniform thickness can be easily formed over the semiconductor substrate 50. Furthermore, if the thickness of the capacitor upper electrode 70' formed by electroplating is increased, the space between adjacent capacitor lower electrodes 66' is fully filled, which results in planarized upper surface of capacitor upper electrode 70'.

FIGS. 5A through 5F are sectional views of successive stages of the method for manufacturing a capacitor of a semiconductor memory device according to the present invention. Although the third embodiment illustrates the application of the inventive method in forming a semiconductor memory device having a capacitor over bit line (COB) structure, the present invention can also be applied to form a semiconductor memory device having a capacitor under bit line (CUB) structure.

Figure 5A:
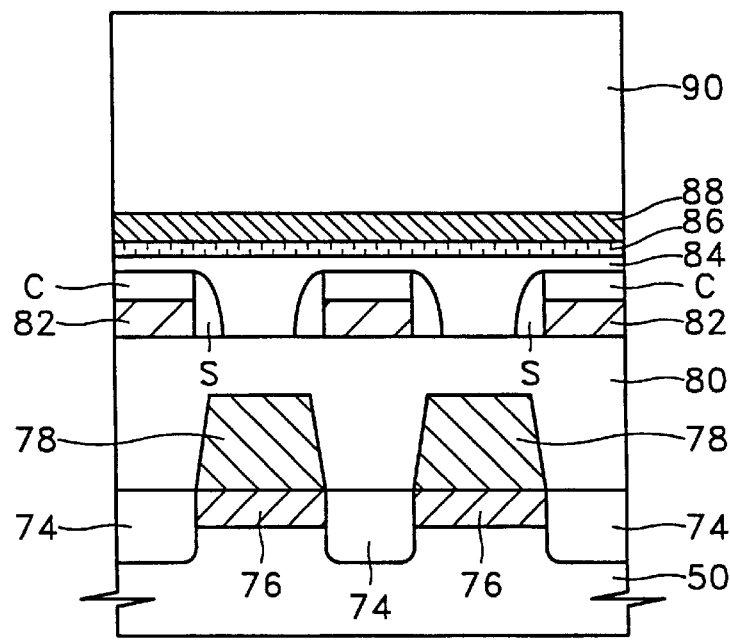
FIGS. 5A through 5F are sectional views illustrating a third embodiment of the inventive method.

Referring to FIG. 5A, the third embodiment of forming a capacitor of a semiconductor device according to the present invention involves forming an isolation layer 74 on the semiconductor substrate 50 to define an active region and a non-active region. The isolation layer 74 can be formed by LOCOS (LOCal Oxidation of Silicon) method or a trench isolation method. Following this, a field effect transistor (FET) including a gate electrode (not shown), a source region 76 and a drain region (not shown) is formed in the active region. After forming a lower electrode pad 78 on the source region 76, a first interlevel dielectric (ILD) film 80 is formed of an oxide film over the semiconductor substrate 50, so that adjacent lower electrode pads 78 are electrically isolated from each other. Although not shown in great detail, the lower electrode pad 78 may be a single layer formed of a conductive polysilicon, or a multi-layer including two or more layers. If the lower electrode pad 78 is formed as a multilayer, multiple layers for the lower electrode pad 78 may be stacked in the following order.

In particular, in forming the lower electrode pad 78 having a stack of multiple layers, the uppermost layer of the lower electrode pad 78 may be formed of a barrier layer. For example, if the lower electrode pad 78 is formed as a bilayer, a conductive polysilicon layer and a barrier layer may be stacked in sequence. Here, the barrier layer may include a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer and a TaAlN layer.

Alternatively, the uppermost layer of the lower electrode pad 78 is formed of a Pt-group metal layer and at least one barrier layer is formed underlying the Pt-group metal layer. For example, if the lower electrode pad 78 is formed as a triple layer, a conductive polysilicon layer, a barrier layer and a Pt-group metal layer may be stacked in sequence. Here, the barrier layer may include a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer and a TaAlN layer. The Ptgroup metal layer may include a Pt layer, a Rh layer, a Ru layer, an Ir layer, an Os layer and a Pd layer.

Following this, a bit line 82 is formed on the first ILD film 80, and a second ILD film 84 is formed of an oxide film to cover the bit line 82 over the semiconductor substrate 50. A spacer S and a capping insulating layer C may be formed on the sidewalls and the top of the bit line 82, respectively, with an insulating layer, for example, a nitride layer, having an etching selectivity with respect to the second ILD film 84. For this case, in a subsequent process of forming an opening to be filled with a capacitor lower electrode, the opening can be self-aligned with the bit line 82.

Next, an etchstop layer 86 is formed over the second ILD film 84. It is preferable that the etchstop layer 86 is formed of a material having a high etching selectivity with respect to the material of the second ILD film 84. For example, the etchstop layer 86 may be formed of a $Si_3N_4$ layer, a $TiO_2$ layer, a $Ta_2O_5$ layer or an $Al_2O_3$ layer.

The reason for forming the etchstop layer 86 is to prevent the layer underlying the etchstop layer 86, for example, the second ILD film 84, from being etched in a subsequent etching process. Accordingly, if there is no concern about damage to the layer underlying the etchstop layer by etchant, which is used in the subsequent etching process, the formation of the etchstop layer 86 need not be performed.

A conductive lower electrode seed layer 88 and a plating mask layer 90 are sequentially formed over the etchstop layer 86. The material and thickness of the material to be used in forming the lower electrode seed layer 88 and the plating mask layer 90, and the method applicable to form these layers, are substantially the same as those described in the first embodiment. For example, a portion of the lower electrode seed layer 88 is removed by wet or dry etching in a subsequent process, and thus it is preferable to form the lower electrode seed layer 88 with a material layer that is easy to remove by wet or dry etching. In particular, if a portion of the lower electrode seed layer 88 is removed by wet etching in a subsequent process, the lower electrode seed layer 88 may be formed of a Cu or Ag layer. On the other hand, if a portion of the lower electrode seed layer 88 is removed by dry etching, the lower electrode seed layer 88 may be formed of a Ru layer. The plating mask layer 90 may be formed of a $SiO_2$ layer.

Figure 5B:
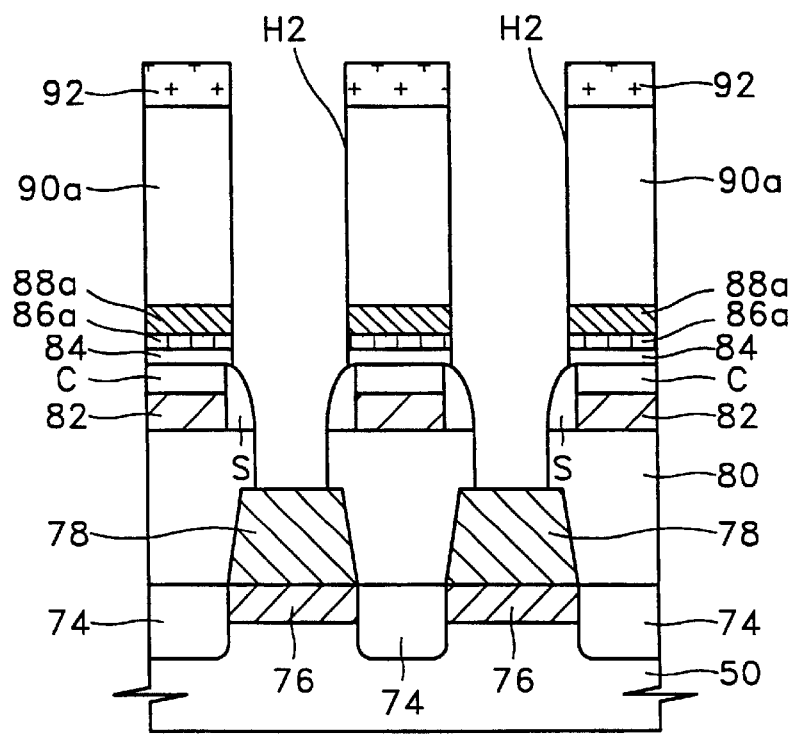

Referring to FIG. 5B, a photosensitive pattern 92 is formed on the plating mask layer 90 by photolithography, to define the width of an opening H2 to be filled with a capacitor lower electrode. Next, a reactive ion etching process is carried out using the photosensitive pattern 92 as an etching mask, to selectively remove portions of the conductive mask layer 90, the lower electrode seed layer 88 and the etchstop layer 86, so that a plating mask pattern 90*a*, a lower electrode seed pattern 88*a* and an etchstop pattern 86*a* are formed. Next, a reactive ion etching process is repeated using the photosensitive pattern 92 as an etching mask to further etch the second IDL film 84 exposed through the etchstop pattern 86*a*, and the first ILD film 80 underlying the second ILD film 84, which results in an opening H2 exposing the lower electrode pad 78. Here, the sidewalls of the lower electrode seed pattern 88*a* are exposed by the opening H2 exposing the lower electrode pad 78.

On the other hand, in the case where the spacer S and the capping insulating layer C, which have an etching selectivity with respect to the second ILD film 84, are further formed on the sidewalls and the top of the bit line 82, a self-aligning technique is applicable in forming the opening H2. In other words, since the spacer S and the capping insulating layer C serve as an etchstop layer in forming the opening H2 by reactive ion etching, the opening H2 exposing the top of the lower electrode pad 78 is self-aligned with the bit line 82. Application of the self-aligning technique in the formation of the opening H2 increases the align margin in forming the photosensitive pattern 92 by photolithography.

Figure 5C:
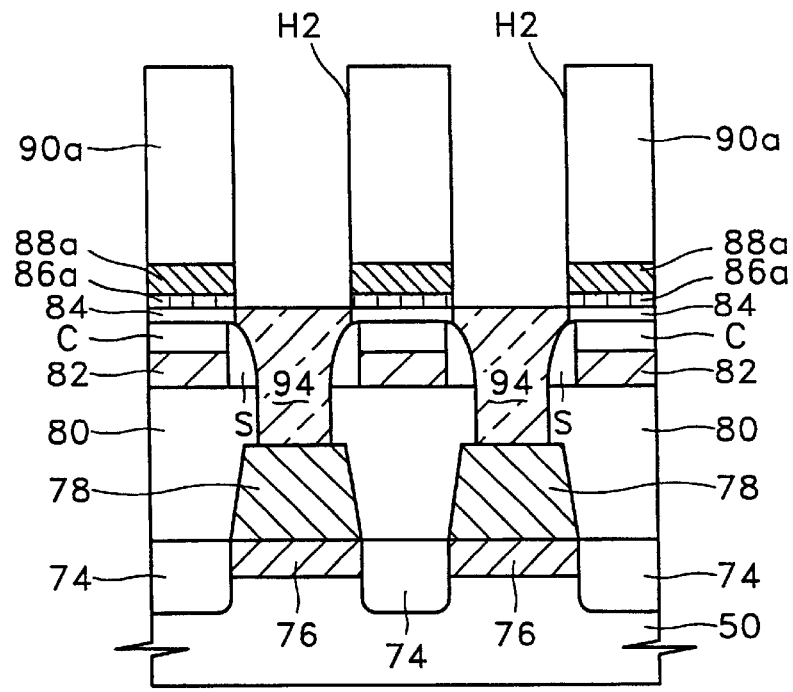

Referring to FIG. 5C, the photosensitive pattern 92 on the plating mask pattern 90*a* is removed. Next, although not illustrated, a barrier material is deposited to fill the opening H2 and to cover the plating mask pattern 90*a*, and planarized to expose the top of the plating mask pattern 90*a*. Then, the barrier material filling the opening H2 is selectively removed by reactive ion etching until the sidewalls of the lower electrode seed pattern 88*a* are exposed, thereby resulting in a barrier layer 94.

For example, a barrier material such as TiN is deposited to fill the opening H2 and to cover the plating mask pattern 90*a* by CVD or atomic layer deposition which provides excellent step coverage characteristics. Next, the deposited TiN is removed by chemical mechanical polishing (CMP) to expose the top of the plating mask pattern 90*a*, and TiN deposited in the opening H2 is then selectively removed by reactive ion etching to expose the sidewalls of the lower electrode seed pattern 88*a*. As a result, the barrier layer 94 electrically connected to the lower electrode pad 78 and filling a lower portion of the opening H2 is obtained. The barrier layer 94 prevents the material of a capacitor lower electrode, which will be formed on the barrier layer 94 in a subsequent process, from diffusing into the lower electrode pad 78, which secures a stable contact resistance. In addition, the barrier layer 94 serves as an adhesive layer between the capacitor lower electrode and the lower electrode pad 78.

The barrier layer 94 may be formed of any material layer other than the TiN layer. The barrier layer 94 may be formed of a metal silicide layer, a metal nitride layer, a doped polysilicon layer or a multi-layer of these layers. Preferably, the metal silicide layer for the barrier layer 94 includes a $WSi_x$ layer, a $TiSi_x$ layer, a $CoSi_x$ layer, a $MoSi_x$ layer and a $TaSi_x$ layer. The metal nitride layer may include a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer and a TaAlN layer.

Figure 5D:
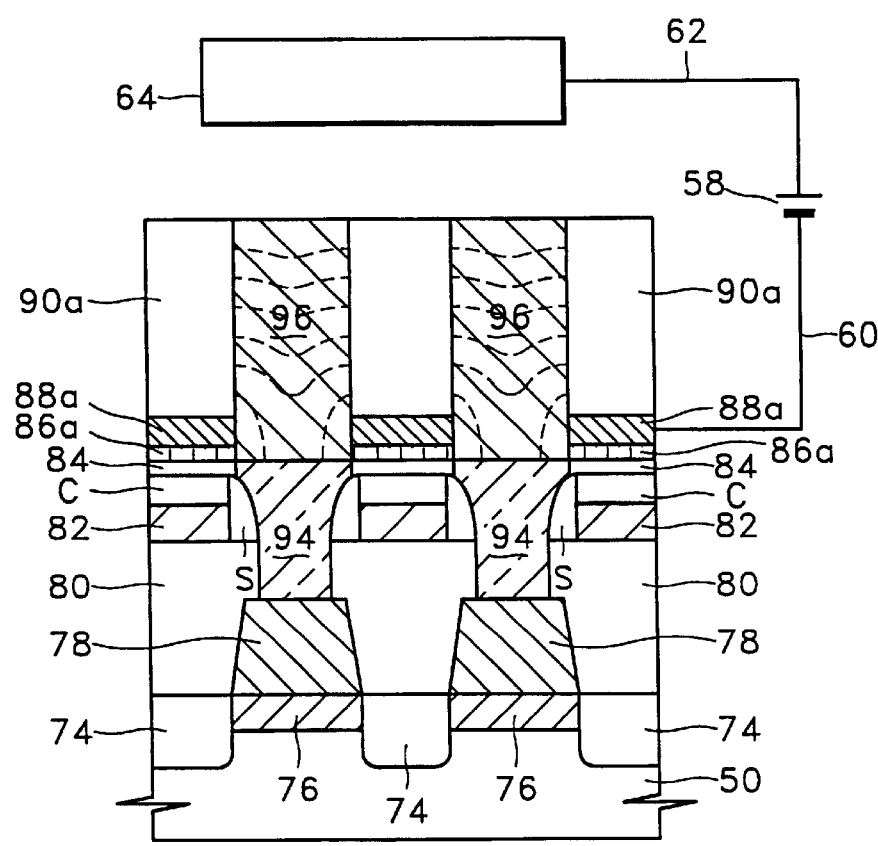

Following this, referring to FIG. 5D, a lower electrode conductive layer 96 is formed on the barrier layer 94 by electroplating which is substantially the same as in the first embodiment. In other words, the semiconductor substrate 50 is immersed into a plating solution in which a metal salt is dissolved, and then the cathode of the power source 58 is connected to the lower electrode seed pattern 88a by the first wire 60, while the anode of the power source 58 is connected to the source electrode 64 by the second wire 62. Then, the lower electrode conductive layer 96 starts to be deposited on the sidewalls of the lower electrode seed pattern 88a. The electroplating continues until the opening H2 is fully filled with the lower electrode conductive layer 96. Here, the type of electroplating solution, the type of material layer available for the source electrode, and the electroplating conditions are substantially the same as those in the first embodiment.

The lower electrode pad 78 may be formed as a multi-layer as well as a single layer made of conductive polysilicon, which was previously described. Especially as the lower electrode pad 78 is formed as a bilayer which is sequentially stacked with a conductive polysilicon layer and a barrier layer, or as a triple layer which is sequentially stacked with a conductive polysilicon layer, a barrier layer and a Pt-group metal layer, the opening H2 is exclusively filled with the lower electrode conductive layer 96, without forming the barrier layer 94 at the lower region of the opening H2. In other words, since the lower electrode pad 78 is formed as a multi-layer including at least one barrier layer, there is no need to form such a separate barrier layer 94 at the bottom portion of the opening H2. Accordingly, the formation of the barrier layer 94 at the lower portion of the opening H2 can be omitted.

Figure 5E:
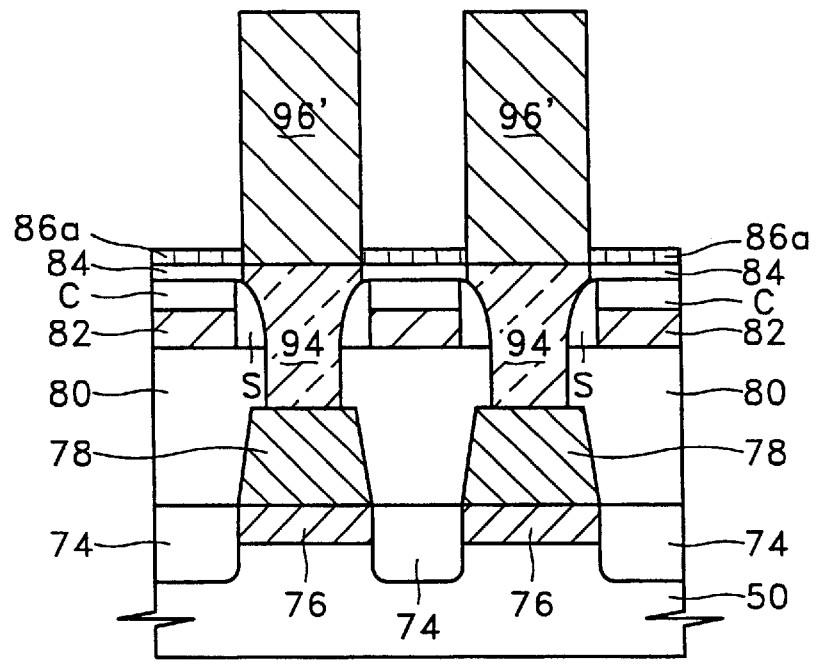

Referring to FIG. 5E, the plating mask pattern 90a and the lower electrode seed pattern 88a are removed by a method that is substantially the same as that in the first embodiment. For example, if the plating mask pattern 90a is formed of $SiO_2$ and the lower electrode seed pattern 88a is formed of Cu or Ag, the plating mask pattern 90a and the lower electrode seed pattern 88a can be simultaneously removed by wet etching with a HF solution. If the plating mask pattern 90a is formed of $SiO_2$ and the lower electrode seed pattern 88a is formed of Ru, the plating mask pattern 90a can be removed by wet etching with a HF or BOE solution, and then the lower electrode seed pattern 88a can be removed by reactive ion etching. Here, the etchstop pattern underlying the lower electrode seed pattern 88a prevents the second ILD film 84 from being etched during removal of the plating mask pattern 90a and/or the lower electrode seed pattern 88a by wet etching and/or dry etching. When the etchstop pattern 86a is formed of a $TiO_2$ layer, the material layer formed underneath the etchstop pattern 86a can be more effectively protected by the etchstop pattern 86a during an etching process. As the plating mask pattern 90a and the lower electrode seed pattern 88a are removed, the sidewalls of the lower electrode conductive layer 96 are exposed, so that a capacitor lower electrode 96' is completed.

Figure 5F:
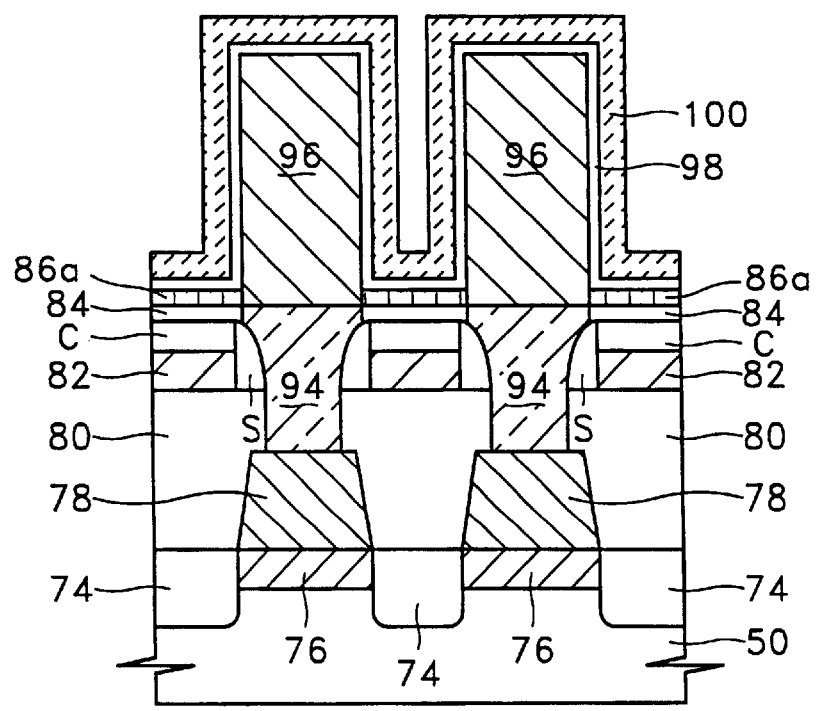

Referring to FIG. 5F, a dielectric film 98 is formed over the capacitor lower electrode 96', and a capacitor upper electrode 100 is formed over the dielectric film 98. The type and thickness of the material layers for the dielectric film 98 and the capacitor upper electrode 100, and a method applicable to form the dielectric film 98 and the capacitor upper electrode 100, are substantially the same as that in the first embodiment. For example, the capacitor upper electrode 100 may be formed by CVD, sputtering or MOD, which was described with reference to FIG. 3F, or by electroplating using the upper electrode seed layer 72, which was described with reference to FIG. 4.

In the third embodiment, the opening H2 can be formed self-aligned with the bit line 82. For this case, a problem of mis-alignment between the barrier layer 94 and the capacitor lower electrode 96' can be prevented. In addition, when electroplating is applied to form the capacitor lower electrode 96', the lower electrode conductive layer 96 is deposited from the sidewalls of the lower electrode seed pattern 88a, occurrence of a void in the opening H2 can be avoided. Furthermore, after the capacitor lower electrode 96' is completed, all the lower electrode seed pattern 88a can be removed, thereby preventing deterioration in characteristics of a semiconductor memory device due to the presence of the lower electrode seed pattern 88a.

The fourth embodiment of the present invention, which will be described with reference to FIGS. 6A through 6D, is substantially the same as that in the third embodiment, except that the lower electrode pad P is formed as a multi-layer including at least one barrier layer 104, and a liner seed layer L electrically connected to the sidewalls of the lower electrode seed pattern 88a is further formed before the electroplating process.

Figure 6A:
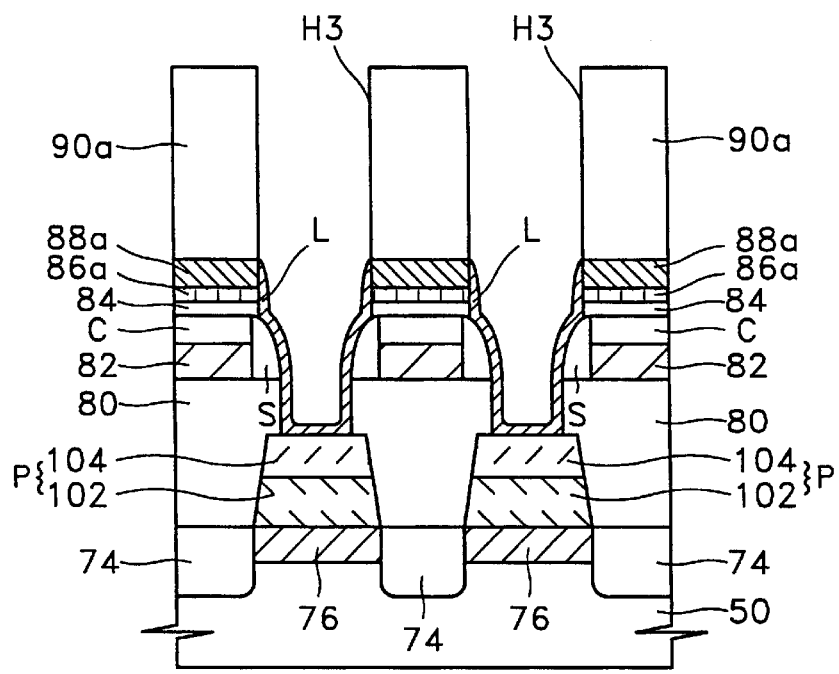
FIGS. 6A through 6D are sectional views illustrating a fourth embodiment of the inventive method.

Referring to FIG. 6A, a lower electrode pad (P) having a multi-layer structure, is formed in an impurity injection region, e.g., a source region 76, of the semiconductor substrate 50. Preferably, the lower electrode pad (P) is formed to include at least one barrier layer formed of metal nitride. The reason for this is that the formation of the lower electrode pad (P) including a barrier layer, as in the fourth embodiment, eliminates the need to form the additional barrier layer 94 (see FIG. 5F) as done in the third embodiment. For example, the lower electrode pad (P) may be formed as a bilayer which is sequentially stacked with a conductive polysilicon layer 102 and a barrier layer 104, as shown in FIG. 6A. The barrier layer 104 may be formed of a material layer that is substantially the same as that used for the barrier layer 94 of FIG. 5F. For example, the barrier layer 104 may be formed of a TiN layer.

After the formation of the lower electrode pad P including at least one barrier layer 104, processes that are substantially the same as those performed in the third embodiment are carried out to form an opening H3 exposing the top of the lower electrode pad P. Following this, a liner seed layer L, which is electrically connected with the sidewalls of the lower electrode seed pattern 88a exposed by the opening H3, is formed.

The liner seed layer L can be formed of a material that is substantially the same as that for the lower electrode seed pattern 88a. Preferably, the liner seed layer L is formed of the same material as that for the lower electrode conductive layer 109 (see FIG. 6C), which will be formed to fill the opening H3 in a subsequent process. Also, it is preferable that the liner seed layer L is formed of a material different from that for the lower electrode seed pattern 88a. For example, if the lower electrode conductive layer 109 (see FIG. 6C) is formed of a Pt layer to fill the opening H3 in a subsequent process, it is preferable that the liner seed layer L is formed of a Pt layer. Such formation of the liner seed layer L with the same material as that for the lower electrode conductive layer can moderate a physical stress acting on the interface between the lower electrode conductive layer 109 (see FIG. 6C) and the liner seed layer L, which occurs due to oxidation of the liner seed layer L when a subsequent thermal treatment is carried out in an oxygen atmosphere so as to enhance the insulating characteristics of the capacitor dielectric film. Formation of the liner seed layer L with a different material from that to be used for the lower electrode conductive layer 109 (see FIG. 6C) filling the opening H3 does not always cause such a physical stress in the interface between the lower electrode conductive layer 109 (see FIG. 6C) and the liner seed layer L. For example, although not the same as that for the lower electrode conductive layer 109 (see FIG. 6C), any material that does not cause the physical stress in the interface between the lower electrode conductive layer 109 (see FIG. 6C) and the liner seed layer L can be used for the liner seed layer L. Also, the type of material layer suitable for the liner seed layer L can be easily selected by one skilled in the art if he or she fully understands the fourth embodiment.

Figure 6B:
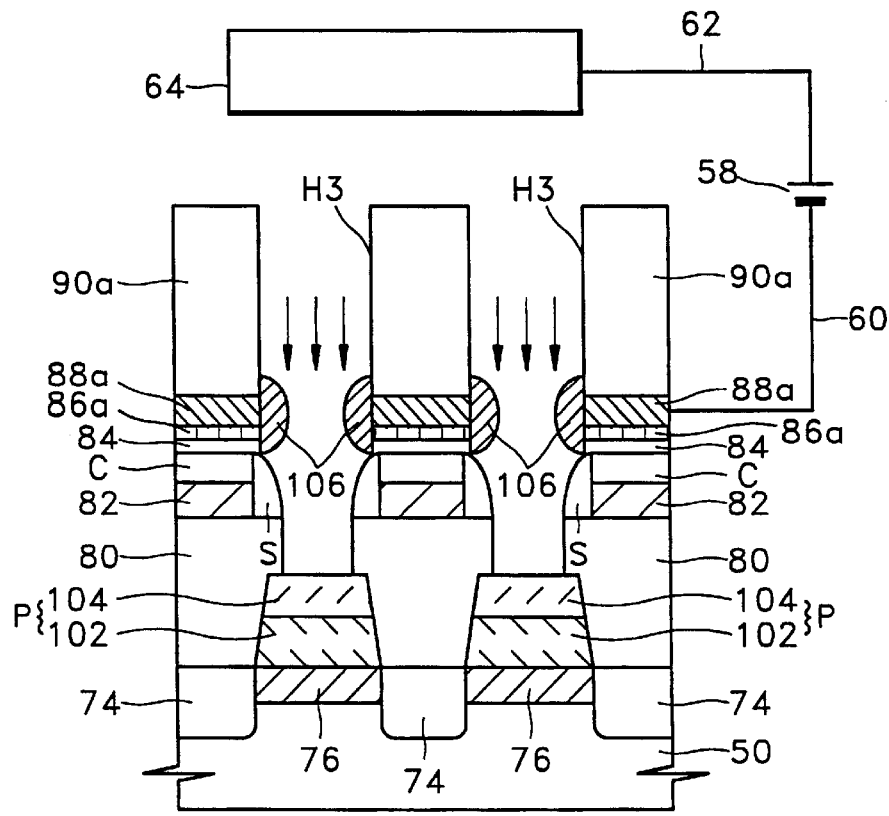

The formation of the liner seed layer will be described in greater detail with reference to FIG. 6B. Referring to FIG. 6B, a method of forming the liner seed layer L involves forming a semi-spherical seed 106 from the sidewalls of the lower electrode seed pattern 88a exposed by the opening H3, by electroplating. This electroplating for the semi-spherical seed 106 may be formed in substantially the same as in the third embodiment. In other words, the cathode of the power source 58 is connected to the lower electrode seed pattern 88a by the first wire 60, while the anode of the power source 58 is connected to the source electrode 64 by the second wire 62. Then, the electroplating is carried out on the semiconductor substrate 50 in an electroplating solution.

When the semi-spherical seed 106 is formed of Pt, the type of plating solution and source electrode 64 available for the electroplating process, and the plating conditions are substantially the same as those applied in the third embodiment. A preferable consideration is that a non-volatile chemically stable material is preferred for the semi-spherical seed 106.

In forming the semi-spherical seed 106, it is preferable that the radius of the semi-spherical seed 106 is less than half the width of the opening H3. In other words, it is preferable that the semi-spherical seed 106 is small enough to not block the opening H3 in the vicinity of the lower electrode seed pattern 88a. The reason why the radius of the semi-spherical seed 106 is limited to less than half the width of the opening H3 will be described below.

After the formation of the semi-spherical seed 106, the semi-spherical seed 106 is physically etched by low-temperature reactive ion etching, which is suitable for selectively etching the semi-spherical seed 106, using, for example, by low-temperature argon (Ar) etching. Preferably, the temperature of a reaction chamber, in which the low-temperature reactive ion etching is carried out, is in the range of 0 to 50° C.

When the semi-spherical seed 106 is etched by low-temperature reactive ion etching as described above, the semi-spherical seed 106 is selectively etched and the material falling down from the semi-spherical seed 106 is redeposited on the bottom of the opening H3, resulting in the liner seed layer L, as shown in FIG. 6A. When the semi-spherical seed 106 is formed of a chemically stable Pt-group metal, such as Pt, a considerable amount of Pt is redeposited. This is because the Pt-group metal that is chemically stable is not easily converted into a gaseous volatile compound by low reactive ion etching such as low-temperature Ar etching.

As previously mentioned, it is preferable that the radius of the semi-spherical seed 106 is less than half the width of the opening H3. The reason for this is related to the formation of the liner seed layer L by reactive ion etching. In other words, if the radius of the semi-spherical seed 106 is greater than or equal to half the width of the opening H3, the liner seed layer L is formed along the upper sidewalls of the opening H3, rather than along the lower sidewalls of the opening H3, during reactive ion etching. If the liner seed layer L is formed along the upper sidewalls of the opening H3, it is more likely that a void is generated in the opening H3 during subsequent electroplating for the lower electrode conductive layer 109 (see FIG. 6C).

Although not shown, a spacer forming technique can be applied to form the liner seed layer L, as shown in FIG. 6A. Firstly, a conductive layer is formed to cover the sidewalls and bottom of the opening H3 and the top surface of the plating mask pattern 90a, and then selectively etched by reactive ion etching into a spacer, which serves as the liner seed layer L. Here, the conductive layer may be formed of a material that is substantially the same as that for the lower electrode seed pattern 88a of the third embodiment. More preferably, the conductive layer is formed of the same material as that for the lower electrode conductive layer 109 (see FIG. 6C), which will later be formed in the opening H3. The reason for this was previously described in association with the formation of the semi-spherical seed 106.

To form the liner seed layer L with Pt layer using such a spacer forming technique, firstly, a Pt layer is deposited to fill the opening H3 and to cover the top surface of the plating mask pattern 90a. The conductive layer for the liner seed layer L can be formed by CVD, atomic layer deposition, sputtering or laser ablation. The method applicable in forming the conductive layer varies depending on the kind of material layer for the conductive layer. For example, if the conductive layer is formed of a Pt layer, use of sputtering is preferred. Sputtering for the conductive layer can be carried out using common sputtering equipment. However, if the aspect ratio of the opening H3 is greater than a reference level, it is preferable to use long through sputtering (LTS) equipment in forming the conductive layer. The thickness of the conductive layer is determined based on the width of the opening H3, the thickness of the liner seed layer L to be formed by the spacer forming technique, and the like. For example, the conductive layer may be deposited to a thickness of 100 nm. According to a result from an experiment conducted by the inventor, in the formation of the liner seed layer L with a Pt layer using LTS equipment, the sputtering conditions may be as follows: DC power of the LTS equipment is about 10 kW, the flow rate of Ar is about 5 sccm, and the temperature of the semiconductor substrate is about 300° C. Following this, the conductive layer deposited over the semiconductor substrate 50 is anisotropically etched by reactive ion etching, e.g., by low-temperature Ar etching, to form the liner seed layer L.

Figure 6C:
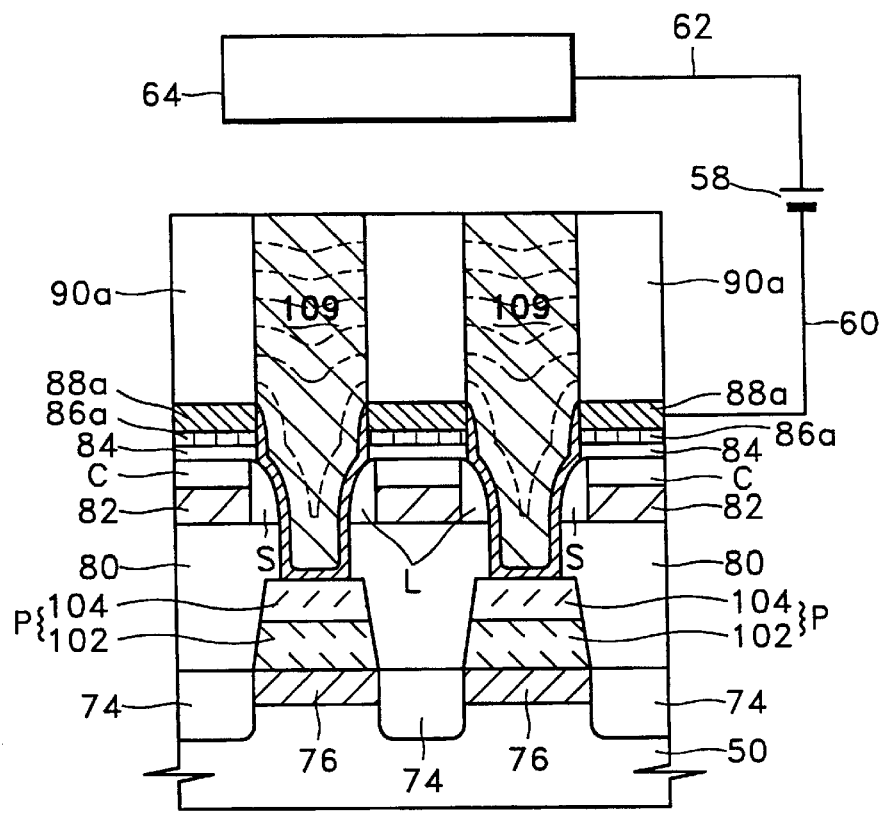

Referring to FIG. 6C, after the liner seed layer L is completed, electroplating is further carried out with the lower electrode seed pattern 88a and the liner seed layer L. This electroplating for the lower electrode conductive layer 109 is carried out in substantially the same way as that performed for the lower electrode conductive layer 96 (see FIG. 5D) in the third embodiment. In other words, the cathode of the power source 58 is connected to the lower electrode seed pattern 88a by the first wire 60, while the anode of the power source 58 is connected to the source electrode 64 by the second wire 62. Then, the electroplating is performed on the semiconductor substrate 50 in a plating solution. As a result, a lower electrode conductive layer 109 starts to be deposited on the liner seed layer L. The electroplating continues until the lower electrode conductive layer 109 fills the opening H3 to a predetermined height in conformity to the height of a desired capacitor lower electrode (refer to a pattern of deposition of the lower electrode conductive layer 109, indicated by dashed lines drawn in the opening H3 of FIG. 6C).

Figure 6D:
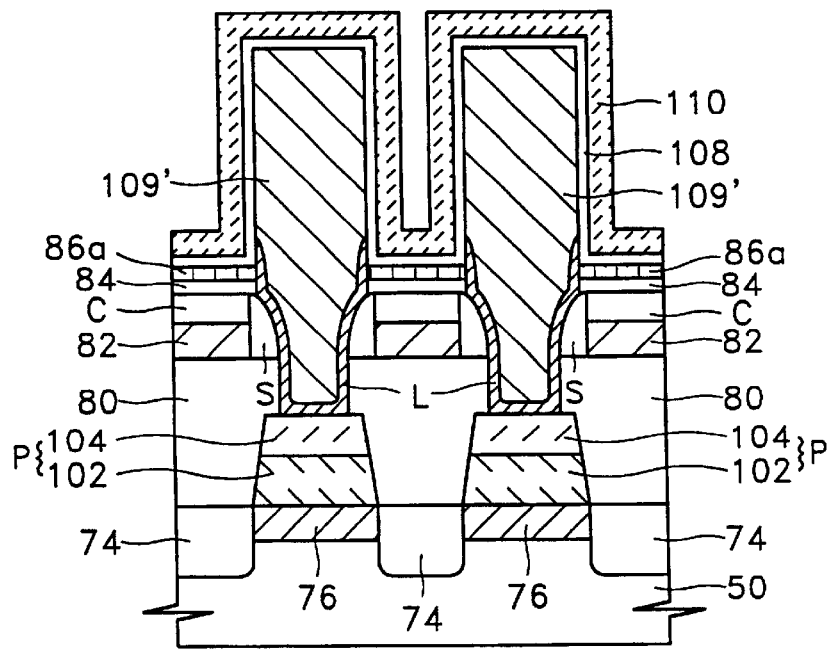

Following this, as shown in FIG. 6D, the plating mask pattern 90a and the lower electrode seed pattern 88a are removed in substantially the same way as in the third embodiment, thereby forming a capacitor lower electrode 109'. If the lower electrode conductive layer 109 and the liner seed layer L are formed of the same material, for example, of Pt, the liner seed layer L can be protected from being etched during the removal of the plating mask pattern 90a and the lower electrode seed pattern 88a. For example, when the lower electrode seed layer 88a is formed of Ag or Cu, and the lower electrode conductive layer 109 and the liner seed layer L are formed of Pt, the lower electrode conductive layer 109 and the liner seed layer L can be protected unremoved while the plating mask pattern 90a and the lower electrode seed pattern 88a are wet etched in a HF solution.

Then, a capacitor dielectric film 108 and a capacitor upper electrode 110 are sequentially formed in substantially the same way as in the third embodiment, thereby completing a capacitor of a semiconductor memory device. In particular, if the liner seed layer L is formed of the same material as that for the lower electrode conductive layer 109, formation of an oxide in the interface between the lower electrode conductive layer 109 and the liner seed layer L, which occurs when the capacitor dielectric film 108 is further heated at a high temperature in an oxygen atmosphere, can be prevented. An increase in leakage current of the capacitor, due to the physical stress by the presence of the oxide between the capacitor lower electrode 109' and the capacitor dielectric layer 108, can be suppressed. Although not shown, it is appreciated that the capacitor upper electrode 110 can be formed by electroplating as in the second embodiment.

In the fourth embodiment, the lower electrode pad P is formed as a multi-layer including a barrier layer. For example, the lower electrode pad P may be formed of a bilayer which is sequentially stacked with the conductive polysilicon layer 102 and the TiN layer 104, thereby eliminating the need to form an additional barrier layer 94 (see FIG. 5C), which was formed in the third embodiment. Thus, the fourth embodiment has an advantage in that the number of steps can be reduced compared to the third embodiment.

In the fifth embodiment, which will be described with reference to FIGS. 7A and 7B, the lower electrode pad P is formed as a multi-layer including at least one barrier layer as in the fourth embodiment. However, in the fifth embodiment, the uppermost layer of the lower electrode pad P is formed of the same material layer as that for the liner seed layer L. Also, the liner seed layer L is formed to contact with the top surface of the lower electrode pad P.

Figure 7A:
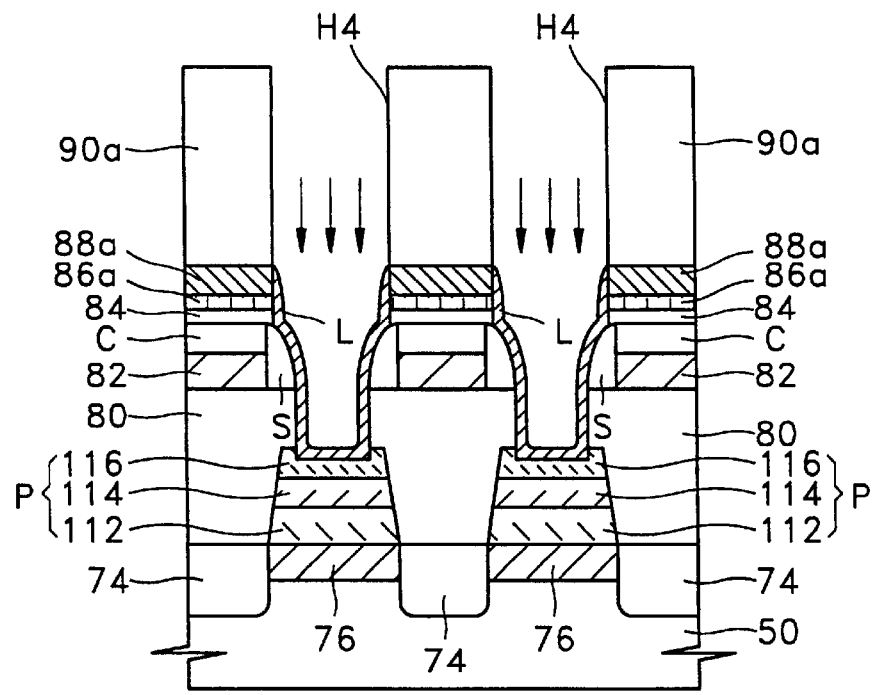
FIGS. 7A and 7B are sectional views illustrating a fifth embodiment of the inventive method.

Referring to FIG. 7A, a lower electrode pad P having a multi-layer structure is formed in an impurity injection region, e.g., in a source region 76, of a semiconductor substrate 50. The lower electrode pad P includes at least one barrier layer and the uppermost layer of the lower electrode pad P is formed of the same material layer as that for the liner seed layer L. It is also preferable that the liner seed layer L is formed of substantially the same material as that for a lower electrode layer which will be formed to fill an opening H4, as in the fourth embodiment.

As shown in FIG. 7A, the lower electrode pad P may be formed as a triple layer which is sequentially stacked with a conductive polysilicon layer 112, a barrier layer 114 and a Pt-group metal layer 116. The barrier layer 114 may be formed of substantially the same material layer as that used for the barrier layer 94 (see FIG. 5C) in the third embodiment. For example, the barrier layer 114 may be formed of a TiN layer and the Pt-group metal layer 116 may be formed of a Pt layer.

Following this, processes that are substantially the processes as those performed in the third embodiment are carried out to form an opening H4 exposing the top of the lower electrode pad P and the sidewalls of the lower electrode seed pattern 88a.

After the formation of the opening H4 is completed, a liner seed layer L electrically connected to the lower electrode seed pattern 88a is formed. In particular, the upper most Pt-group metal layer 116 of the lower electrode pad P is etched by reactive ion etching. During the reactive ion etching, the Pt-group metal layer 116 is etched and the material separated from the Pt-group metal by the etching is redeposited along the lower sidewalls of the opening H4, thereby resulting in the liner seed layer L electrically connected to the sidewalls of the lower electrode seed pattern 88a. Preferably, the Pt-group metal layer 116 is etched by a low-temperature Ar etching technique, and the temperature of a reaction chamber for the low-temperature Ar etching is in the range of 0 to 50° C.

Since the liner seed layer L is formed by reactive ion etching the uppermost layer, i.e., the Pt-group metal layer 116, of the lower electrode pad P, the bottom surface of the liner seed layer L contacts with the recessed top surface of the lower electrode pad P, as shown in FIG. 7A.

Figure 7B:
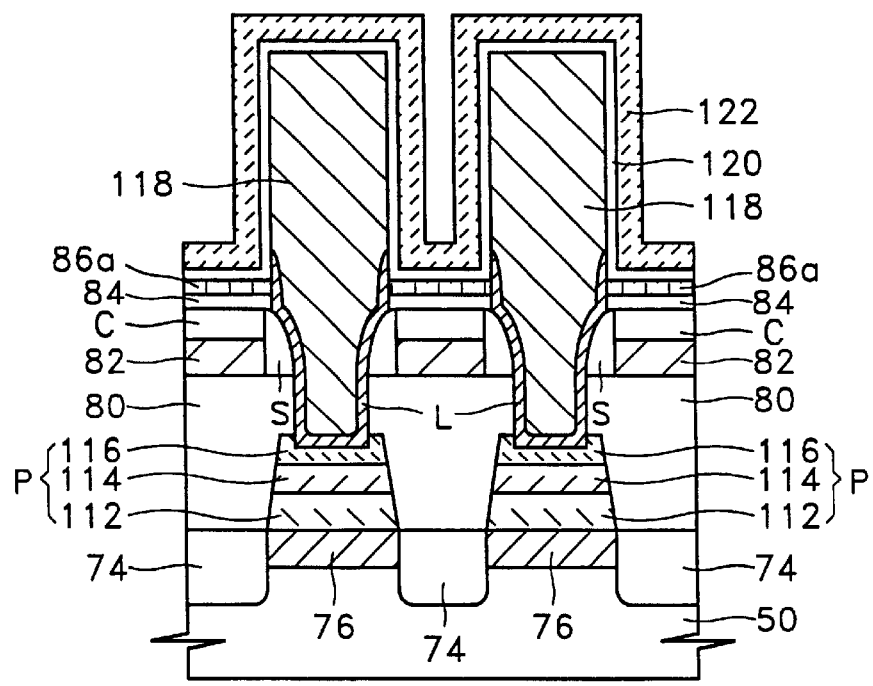

Referring to FIG. 7B, electroplating is carried out with the lower electrode seed pattern 88a and the liner seed layer L, to form a lower electrode conductive layer 118 filling the opening H4. The electroplating for the lower electrode conductive layer 118 is performed in substantially the same way as in the third embodiment. As the electroplating is performed, a metal from the source electrode starts to be deposited on the liner seed layer L. The electroplating continues until the lower electrode conductive layer 118 is filled in the opening H4 to a predetermined height in conformity to the height of a desired capacitor lower electrode. Here, the type of material available as the source electrode, and the plating solution and the plating conditions are substantially the same as those of the third embodiment.

After filling the opening H4 with the lower electrode conductive layer 118 by the electroplating as described above, the removal of the plating mask pattern 90a and the lower electrode seed pattern 88a, and the formation of the capacitor dielectric layer 120 and the capacitor upper electrode 122 are followed in substantially the same way as in the third embodiment, thereby completing a capacitor of a semiconductor memory device according to the present invention. Although not shown, it is appreciated that the capacitor upper electrode 122 can be formed by electroplating as in the second embodiment.

The formation of a capacitor lower electrode by the inventive method can solve the conventional problems in separating the lower electrode into unit cells by dry etching. According to another aspect of the present invention, an opening exposing a lower electrode pad can be formed by a self-aligning technique with a masked bit line, and thus the opening can be obtained by performing only one photolithography process. According to still another aspect of the present invention, after the formation of the lower electrode by electroplating, a lower electrode seed pattern used for the electroplating can be completely removed, thereby preventing deterioration of electrical properties of the capacitor due to the lower electrode seed layer left after the electroplating. Furthermore, it is not necessary to form the lower electrode and the lower electrode seed layer with the same material. The lower electrode seed layer can be formed of a different material from that for the lower electrode, as needed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:
   forming a first electrically conductive layer on a semiconductor substrate;
   forming a first electrically insulating layer on the first electrically conductive layer;
   patterning the first electrically insulating layer and the first electrically conductive layer to define an opening in the first electrically insulating layer and expose a sidewall of the first electrically conductive layer;
   electroplating a second electrically conductive layer into the opening, using the exposed sidewall of the first electrically conductive layer as an electroplating seed; and
   removing the patterned first electrically insulating layer and at least a portion of the patterned first electrically conductive layer to define a first capacitor electrode comprising the electroplated second electrically conductive layer.

2. The method of claim 1, wherein said patterning step comprises selectively etching the first electrically insulating layer and the first electrically conductive layer in sequence to expose the semiconductor substrate and expose sidewalls of the first electrically conductive layer.

3. The method of claim 2, wherein said electroplating step comprises electroplating a second electrically conductive layer into the opening, using the exposed sidewalls of the first electrically conductive layer as an electroplating seed; and wherein said removing step comprises removing all of the first electrically conductive layer.

4. The method of claim 3, wherein said removing step is followed by the steps of:
   forming a capacitor dielectric layer on the first capacitor electrode; and
   forming a second capacitor electrode on the capacitor dielectric layer, opposite the first capacitor electrode.

5. The method of claim 3, wherein said removing step is followed by the steps of:
   forming a capacitor dielectric layer on the first capacitor electrode;
   forming an electroplating seed layer on the capacitor dielectric layer; and
   electroplating a second capacitor electrode onto the electroplating seed layer.

6. The method of forming an integrated circuit memory device capacitor, comprising the steps of:
   forming an electrode pad on an integrated circuit substrate;
   forming a first interlevel dielectric layer on the electrode pad;
   forming a plurality of bit lines on the first interlevel dielectric layer;
   forming a seed layer on the plurality of bit lines;
   forming a plating mask layer on the seed layer;
   selectively etching the plating mask layer and the seed layer to define an opening therein that exposes sidewalls of the seed layer; and
   electroplating at least a portion of a first capacitor electrode into the opening, using the exposed sidewalls of the seed layer as an electroplating seed.

7. The method of claim 6, wherein said selective etching step comprises selectively etching the plating mask layer, the seed layer and the first interlevel dielectric layer in sequence to expose the electrode pad; and wherein said electroplating step is preceded by the step of forming a barrier material layer on the exposed electrode pad.

8. The method of claim 7, wherein said step of forming a barrier material layer comprises the steps of:
   conformally depositing a barrier material layer into the opening and onto the electrode pad; and
   etching back the barrier material layer to expose the sidewalls of the seed layer.

9. The method of claim 8, wherein the barrier material layer and the seed layer comprise different materials; and wherein said electroplating step is followed by the step of removing the plating mask layer and the seed layer to expose the first capacitor electrode.

10. The method of claim 9, further comprising the steps of:
    forming a capacitor dielectric layer on the first capacitor electrode; and
    forming a second capacitor electrode on the capacitor dielectric layer.

11. A method for manufacturing a capacitor of a semiconductor memory device, comprising the steps of:
    (a) forming a lower electrode seed layer over a semiconductor substrate having a conductive region electrically connected to an active region formed in the semiconductor substrate;
    (b) forming a plating mask layer over the lower electrode seed layer;
    (c) patterning the plating mask layer and the lower electrode seed layer to form a plating mask pattern and a lower electrode seed pattern, both of which define a region where a capacitor lower electrode is to be formed, thereby forming an opening exposing the conductive region and the sidewalls of the plating mask pattern;
    (d) performing electroplating using the lower electrode seed pattern exposing its sidewalls by the opening, to form a lower electrode conductive layer in the opening; and
    (e) removing the plating mask pattern and the lower electrode seed pattern to expose the sidewalls of the lower electrode conductive layer, thereby resulting in a capacitor lower electrode.

12. The method of claim 11, wherein the lower electrode seed layer comprises a platinum (Pt) group metal layer, a Pt group metal oxide layer, a conductive material layer having a perovskite structure, a conductive metal layer, a metal silicide layer, a metal nitride layer or a multi-layer of these layer.

13. The method of claim 11, wherein the lower electrode seed layer is formed of a Pt layer, a rhodium (Rh) layer, a ruthenium (Ru) layer, an iridium (Ir) layer, an osmium (Os) layer, a palladium (Pd) layer, a $PtO_x$ layer, a $RhO_x$ layer, a $RuO_x$ layer, a $IrO_x$ layer, an $OSO_x$ layer, a $PdO_x$ layer, a CaRuO$_3$ layer, a SrRuO$_3$ layer, a BaRuO$_3$ layer, a BaSrRuO$_3$ layer, a CaIrO$_3$ layer, a SrIrO$_3$ layer, a BaIrO$_3$ layer, a (La,SR)CoO$_3$ layer, a copper (Cu) layer, an aluminum (Al) layer, a tantalum (Ta) layer, a molybdenum (Mo) layer, a tungsten (W) layer, a gold (Au) layer, a silver (Ag) layer, a WSi$_x$ layer, a TiSi$_x$ layer, a CoSi$_x$ layer, a MoSi$_x$ layer, a TaSi$_x$ layer, a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer, a TaAlN layer or a multi-layer of these layers.

14. The method of claim 11, wherein the plating mask layer is formed of a boro-phospho-silicate glass (BPSG) layer, a spin-on glass (SOG) layer, a phospho-silicate glass (PSG) layer, a photoresist layer, a diamond-like carbon layer, a SiO$_x$ layer, a SiN$_x$ layer, a SiON$_x$ layer, a TiO$_x$ layer, a AlO$_x$ layer, a AlN$_x$ layer or a multi-layer of these layers.

15. The method of claim 11, wherein in step (d), a plating solution containing the salt of a metal selected from the group consisting of Pt, Ir, Ru, Rh, Os, Pd, Au, Ag, Co, Ni and a mixture of these metals is used, Pt, Ir, Ru, Rh, Os, Pd, Au, Ag, Co, Ni or an alloy of these metals is used as the anode, and the lower electrode seed pattern is used as the cathode.

16. The method of claim 11, wherein the conductive mask pattern and the lower electrode seed pattern are removed by wet etching or dry etching.

17. The method of claim 11, wherein the plating mask pattern and the lower electrode seed pattern is removed by performing wet etching or drying etching one time.

18. The method of claim 11, further comprising
forming a dielectric film over the capacitor lower electrode; and
forming a capacitor upper electrode on the dielectric film.

19. The method of claim 18, wherein the dielectric film comprises a Ta$_2$O$_5$ layer, a SrTiO$_3$ layer, a (Ba,Sr)TiO$_3$ layer, a PbZrTiO$_3$ layer, a SrBi$_2$Ta$_2$O$_9$ layer, a (Pb,La)(Zr, Ti)O$_3$ layer, a Bi$_4$Ti$_3$O$_{12}$ layer or a multi-layer of these layers.

20. The method of claim 18, wherein the capacitor upper electrode is formed by chemical vapor deposition (CVD), sputtering, metal-organic deposition (MOD), or spin coating with Pt colloid.

21. The method of claim 18, further comprising forming an upper electrode seed layer over the dielectric film, wherein the capacitor upper electrode is formed by electroplating with the upper electrode seed layer.

22. The method of claim 21, wherein the upper electrode seed layer comprises a platinum (Pt) group metal layer, a Pt group metal oxide layer, a conductive material layer having a perovskite structure, a conductive metal layer or a multi-layer of these layers.

23. The method of claim 21, wherein in forming the capacitor upper electrode, a plating solution containing the salt of a metal selected from the group consisting of Pt, Ir, Ru, Rh, Os, Pd, Au, Ag, Cu, Mo, Co, Ni, Zn, Cr, Fe and a mixture of these metals is used, Pt, Ir, Ru, Rh, Os, Pd, Au, Ag, Cu, Mo, Co, Ni, Zn, Cr, Fe or an alloy of these metals is used as the anode, and the upper electrode seed layer is used as the cathode.

24. The method of claim 11, further comprising forming an etchstop layer over the semiconductor substrate, wherein the lower electrode seed layer is formed over the etchstop layer, and the opening is formed by patterning the plating mask layer, the lower electrode seed layer and the etchstop layer.

25. The method of claim 24, wherein the etchstop layer is formed of a Si$_3$N$_4$ layer, a Ta$_2$O$_5$ layer, a TiO$_2$ layer, a Al$_2$O$_3$ layer or a multi-layer of these layers.

26. A method for manufacturing a capacitor of a semiconductor memory device, comprising the steps of:
(a) forming a lower electrode pad with a conductive material on an active region of a semiconductor substrate;
(b) forming a first interlevel dielectric (ILD) film over the lower electrode pad;
(c) forming bit lines on the first ILD film;
(d) forming a second ILD film over the bit lines;
(e) forming a lower electrode seed layer over the second ILD film;
(f) forming a plating mask layer over the lower electrode seed layer;
(g) patterning the plating mask layer, the lower electrode seed layer, the second ILD film and the first ILD film by photolithography to form an opening exposing the lower electrode pad;
(h) filling the opening with a conductive layer, the conductive layer deposited on or over the substantially the same level to the top of the lower electrode seed layer, by electroplating with the patterned lower electrode seed layer; and
(i) removing the patterned plating mask and lower electrode seed layer to expose the sidewalls of the conductive layer, thereby forming a capacitor lower electrode.

27. The method of claim 26, wherein the lower electrode seed layer comprises a platinum (Pt) group metal layer, a Pt group metal oxide layer, a conductive material layer having a perovskite structure, a conductive metal layer, a metal silicide layer, a metal nitride layer or a multi-layer of these layer.

28. The method of claim 26, wherein step (h) comprises:
forming a conductive barrier layer on the lower electrode pad exposed by the opening so as not to cover the sidewalls of the lower electrode seed layer exposed by the opening; and
performing electroplating with the patterned lower electrode seed layer to form the conductive layer over the barrier layer.

29. The method of claim 28, wherein forming the barrier layer comprises:
depositing a barrier material to fill the opening and to cover the plating mask layer;
removing the barrier material until the top of the plating mask pattern is exposed; and
selectively removing the barrier material filling the opening to expose the sidewalls of the patterned lower electrode seed layer.

30. The method of claim 29, wherein the barrier layer is formed of a metal silicide layer, a metal nitride layer, a doped polysilicon layer or a multi-layer of these layers.

31. The method of claim 26, wherein in the electroplating process, a plating solution containing the salt of a metal selected from the group consisting of Pt, Ir, Ru, Rh, Os, Pd, Au, Ag, Co, Ni and a mixture of these metals is used, Pt, Ir, Ru, Rh, Os, Pd, Au, Ag, Co, Ni or an alloy of these metals is used as a source electrode, and the patterned lower electrode seed layer is used as the cathode.

32. The method of claim 26, wherein step (i) is to remove the patterned plating mask layer and lower electrode seed layer by wet or dry etching.

33. The method of claim 26, wherein step (i) is to remove the patterned plating mask layer and lower electrode seed layer by performing wet or dry etching one time.

34. The method of claim 26, further comprising forming an etchstop layer over the second ILD film before forming the lower electrode seed layer, wherein the lower electrode seed layer is formed over the etchstop layer, and in forming the opening, the etchstop layer is patterned.

35. The method of claim 34, wherein the etchstop layer is formed of a $Si_3N_4$ layer, a $Ta_2O_5$ layer, a $TiO_2$ layer or a $Al_2O_3$ layer.

36. The method of claim 26, before step (d), further comprising forming a spacer and a capping insulating layer on the sidewalls and the top surface of the bit lines, respectively, using a material having an etching selectivity with respect to the second ILD film, wherein step (g) is to form an opening self-aligned with the bit line masked by the spacer and the capping insulating layer.

37. The method of claim 26, before step (h), further comprising forming a liner seed layer along a lower portion of the opening, the liner seed layer electrically connected to the lower electrode seed layer exposed by the opening.

38. The method of claim 37, wherein forming the liner seed layer comprises:

forming a semi-spherical seed on the sidewalls of the patterned lower electrode seed layer; and reactive ion etching the semi-spherical seed at a low temperature to redeposit the material falling from the semi-spherical seed along the lower portion of the opening.

39. The method of claim 38, wherein the radius of the semi-spherical seed is less than half the width of the opening.

40. The method of claim 38, wherein the semi-spherical seed is formed of the same material layer as that of the conductive layer.

41. The method of claim 37, wherein forming the liner seed layer comprises:

lining the semiconductor substrate having the opening with a conductive material; and reactive ion etching the conductive material at a low temperature to form a spacer as the liner seed layer.

42. The method of claim 41, wherein the conductive material is formed of the same material as that of the conductive layer.

43. The method of claim 37, wherein the lower electrode pad is formed as a multi-layer.

44. The method of claim 43, wherein the uppermost layer of the lower electrode pad is formed as a conductive barrier layer.

45. The method of claim 44, wherein the lower electrode pad has a bilayered structure including a conductive polysilicon layer and a metal nitride layer stacked in sequence.

46. The method of claim 43, wherein the uppermost layer of the lower electrode pad is a Pt group metal layer, the lower electrode pad includes at least one conductive barrier layer underneath the uppermost layer, and the liner seed layer is formed by reactive ion etching the uppermost layer of the lower electrode pad at a low temperature.

47. The method of claim 46, wherein the uppermost layer of the lower electrode pad is formed of the same material as that of the conductive layer.

* * * * *